United States Patent
Melanson

(10) Patent No.: US 8,125,805 B1
(45) Date of Patent: Feb. 28, 2012

(54) SWITCH-MODE CONVERTER OPERATING IN A HYBRID DISCONTINUOUS CONDUCTION MODE (DCM)/CONTINUOUS CONDUCTION MODE (CCM) THAT USES DOUBLE OR MORE PULSES IN A SWITCHING PERIOD

(75) Inventor: John Laurence Melanson, Austin, TX (US)

(73) Assignee: Cirrus Logic Inc., Austin, TX (US)

( * ) Notice: Subject to any disclaimer, the term of this patent is extended or adjusted under 35 U.S.C. 154(b) by 938 days.

(21) Appl. No.: 12/113,536

(22) Filed: May 1, 2008

Related U.S. Application Data

(60) Provisional application No. 60/915,547, filed on May 2, 2007.

(51) Int. Cl.
*H02M 7/217* (2006.01)
(52) U.S. Cl. .......................... 363/89; 363/41
(58) Field of Classification Search .......... 363/89, 363/41; 323/222, 207
See application file for complete search history.

(56) References Cited

U.S. PATENT DOCUMENTS

| | | |
|---|---|---|
| 3,316,495 A | 4/1967 | Sherer |
| 3,423,689 A | 1/1969 | Miller et al. |
| 3,586,988 A | 6/1971 | Weekes |
| 3,725,804 A | 4/1973 | Langan |
| 3,790,878 A | 2/1974 | Brokaw |
| 3,881,167 A | 4/1975 | Pelton et al. |
| 4,075,701 A | 2/1978 | Hofmann |
| 4,334,250 A | 6/1982 | Theus |
| 4,414,493 A | 11/1983 | Henrich |
| 4,476,706 A | 10/1984 | Hadden et al. |
| 4,677,366 A | 6/1987 | Wilkinson et al. |
| 4,683,529 A | 7/1987 | Bucher |
| 4,700,188 A | 10/1987 | James |
| 4,737,658 A | 4/1988 | Kronmuller et al. |
| 4,797,633 A | 1/1989 | Humphrey |
| 4,937,728 A | 6/1990 | Leonardi |

(Continued)

FOREIGN PATENT DOCUMENTS

EP 0585789 A1 3/1994

(Continued)

OTHER PUBLICATIONS

D. Hausman, Lutron, RTISS-TE Operation, Real-Time Illumination Stability Systems for Trailing-Edge (Reverse Phase Control) Dimmers, v. 1.0 Dec. 2004.

(Continued)

*Primary Examiner* — Harry Behm
(74) *Attorney, Agent, or Firm* — Steven Lin, Esq.

(57) ABSTRACT

A switching converter controller and method for controlling a switch-mode converter in a hybrid discontinuous conduction mode (DCM)/continuous conduction mode (CCM) mode are disclosed. The hybrid mode involves using double (two) or more switching pulses in a switching period of a control signal for controlling the switch-mode converter. The switching period is defined by a switch on-time duration, a switch off-time duration, and an N number of switching pulses. N is an integer greater than one. An inductor current through the inductor of the switch-mode converter is zero before an initial switching pulse, is zero after a last switching pulse, and is non-zero for all other times within the switching period. The switch-mode converter controller can be used as a power factor correction controller for a power factor corrector. The switch-mode converter controller can be implemented on a single integrated circuit.

23 Claims, 8 Drawing Sheets

U.S. PATENT DOCUMENTS

| | | | |
|---|---|---|---|
| 4,940,929 A | 7/1990 | Williams | |
| 4,973,919 A | 11/1990 | Allfather | |
| 4,979,087 A | 12/1990 | Sellwood et al. | |
| 4,980,898 A | 12/1990 | Silvian | |
| 4,992,919 A | 2/1991 | Lee et al. | |
| 4,994,952 A | 2/1991 | Silva et al. | |
| 5,001,620 A | 3/1991 | Smith | |
| 5,109,185 A | 4/1992 | Ball | |
| 5,121,079 A | 6/1992 | Dargatz | |
| 5,206,540 A | 4/1993 | de Sa e Silva et al. | |
| 5,264,780 A | 11/1993 | Bruer et al. | |
| 5,278,490 A | 1/1994 | Smedley | |
| 5,323,157 A | 6/1994 | Ledzius et al. | |
| 5,359,180 A | 10/1994 | Park et al. | |
| 5,383,109 A | 1/1995 | Maksimovic et al. | |
| 5,424,932 A | 6/1995 | Inou et al. | |
| 5,477,481 A | 12/1995 | Kerth | |
| 5,479,333 A | 12/1995 | McCambridge et al. | |
| 5,481,178 A | 1/1996 | Wilcox et al. | |
| 5,565,761 A | 10/1996 | Hwang | |
| 5,589,759 A | 12/1996 | Borgato et al. | |
| 5,638,265 A | 6/1997 | Gabor | |
| 5,644,214 A * | 7/1997 | Lee | 323/211 |
| 5,691,890 A | 11/1997 | Hyde | |
| 5,747,977 A | 5/1998 | Hwang | |
| 5,757,635 A | 5/1998 | Seong | |
| 5,764,039 A | 6/1998 | Choi et al. | |
| 5,781,040 A | 7/1998 | Myers | |
| 5,783,909 A | 7/1998 | Hochstein | |
| 5,798,635 A | 8/1998 | Hwang et al. | |
| 5,900,683 A | 5/1999 | Rinehart et al. | |
| 5,929,400 A | 7/1999 | Colby et al. | |
| 5,946,202 A | 8/1999 | Balogh | |
| 5,946,206 A | 8/1999 | Shimizu et al. | |
| 5,952,849 A | 9/1999 | Haigh et al. | |
| 5,960,207 A | 9/1999 | Brown | |
| 5,963,086 A | 10/1999 | Hall | |
| 5,966,297 A | 10/1999 | Minegishi | |
| 5,994,885 A | 11/1999 | Wilcox et al. | |
| 6,016,038 A | 1/2000 | Mueller et al. | |
| 6,043,633 A | 3/2000 | Lev et al. | |
| 6,072,969 A | 6/2000 | Yokomori et al. | |
| 6,083,276 A | 7/2000 | Davidson et al. | |
| 6,084,450 A | 7/2000 | Smith et al. | |
| 6,150,774 A | 11/2000 | Mueller et al. | |
| 6,181,114 B1 | 1/2001 | Hemena et al. | |
| 6,211,627 B1 | 4/2001 | Callahan | |
| 6,229,271 B1 | 5/2001 | Liu | |
| 6,229,292 B1 | 5/2001 | Redl et al. | |
| 6,246,183 B1 | 6/2001 | Buonavita | |
| 6,259,614 B1 | 7/2001 | Ribarich et al. | |
| 6,300,723 B1 | 10/2001 | Wang et al. | |
| 6,304,066 B1 | 10/2001 | Wilcox et al. | |
| 6,304,473 B1 | 10/2001 | Telefus et al. | |
| 6,343,026 B1 | 1/2002 | Perry | |
| 6,344,811 B1 | 2/2002 | Melanson | |
| 6,385,063 B1 | 5/2002 | Sadek et al. | |
| 6,407,691 B1 | 6/2002 | Yu | |
| 6,441,558 B1 | 8/2002 | Muthu et al. | |
| 6,445,600 B2 | 9/2002 | Ben-Yaakov | |
| 6,452,521 B1 | 9/2002 | Wang | |
| 6,469,484 B2 | 10/2002 | L'Hermite et al. | |
| 6,486,645 B1 * | 11/2002 | Van Auken | 323/287 |
| 6,495,964 B1 | 12/2002 | Hayes | |
| 6,509,913 B2 | 1/2003 | Martin, Jr. et al. | |
| 6,580,258 B2 | 6/2003 | Wilcox et al. | |
| 6,583,550 B2 | 6/2003 | Iwasa et al. | |
| 6,628,106 B1 | 9/2003 | Batarseh et al. | |
| 6,636,003 B2 | 10/2003 | Rahm et al. | |
| 6,646,848 B2 | 11/2003 | Yoshida et al. | |
| 6,688,753 B2 | 2/2004 | Calon et al. | |
| 6,713,974 B2 | 3/2004 | Patchornik et al. | |
| 6,724,174 B1 | 4/2004 | Esteves et al. | |
| 6,727,832 B1 | 4/2004 | Melanson | |
| 6,737,845 B2 | 5/2004 | Hwang | |
| 6,741,123 B1 | 5/2004 | Anderson et al. | |
| 6,753,661 B2 | 6/2004 | Muthu et al. | |
| 6,756,772 B2 | 6/2004 | McGinnis | |
| 6,768,655 B1 | 7/2004 | Yang et al. | |
| 6,781,351 B2 | 8/2004 | Mednik et al. | |
| 6,788,011 B2 | 9/2004 | Mueller et al. | |
| 6,806,659 B1 | 10/2004 | Mueller et al. | |
| 6,839,247 B1 | 1/2005 | Yang | |
| 6,860,628 B2 | 3/2005 | Robertson et al. | |
| 6,870,325 B2 | 3/2005 | Bushell et al. | |
| 6,873,065 B2 | 3/2005 | Haigh et al. | |
| 6,882,552 B2 | 4/2005 | Telefus et al. | |
| 6,894,471 B2 | 5/2005 | Corva et al. | |
| 6,933,706 B2 | 8/2005 | Shih | |
| 6,940,733 B2 | 9/2005 | Schie et al. | |
| 6,944,034 B1 | 9/2005 | Shytenberg et al. | |
| 6,956,750 B1 | 10/2005 | Eason et al. | |
| 6,958,920 B2 | 10/2005 | Mednik et al. | |
| 6,963,496 B2 | 11/2005 | Bimbaud | |
| 6,970,503 B1 | 11/2005 | Kalb | |
| 6,975,523 B2 | 12/2005 | Kim et al. | |
| 6,980,446 B2 | 12/2005 | Simada et al. | |
| 7,003,023 B2 | 2/2006 | Krone et al. | |
| 7,034,611 B2 | 4/2006 | Oswal et al. | |
| 7,050,509 B2 | 5/2006 | Krone et al. | |
| 7,064,531 B1 | 6/2006 | Zinn | |
| 7,075,329 B2 | 7/2006 | Chen et al. | |
| 7,078,963 B1 | 7/2006 | Andersen et al. | |
| 7,088,059 B2 | 8/2006 | McKinney et al. | |
| 7,102,902 B1 | 9/2006 | Brown et al. | |
| 7,106,603 B1 | 9/2006 | Lin et al. | |
| 7,109,791 B1 | 9/2006 | Epperson et al. | |
| 7,126,288 B2 | 10/2006 | Ribarich et al. | |
| 7,145,295 B1 | 12/2006 | Lee et al. | |
| 7,158,633 B1 | 1/2007 | Hein | |
| 7,161,816 B2 | 1/2007 | Shytenberg et al. | |
| 7,183,957 B1 | 2/2007 | Melanson | |
| 7,221,130 B2 | 5/2007 | Ribeiro et al. | |
| 7,233,135 B2 | 6/2007 | Noma et al. | |
| 7,246,919 B2 | 7/2007 | Porchia et al. | |
| 7,266,001 B1 * | 9/2007 | Notohamiprodjo et al. | 363/59 |
| 7,288,902 B1 | 10/2007 | Melanson | |
| 7,292,013 B1 | 11/2007 | Chen et al. | |
| 7,310,244 B2 | 12/2007 | Yang et al. | |
| 7,345,458 B2 | 3/2008 | Kanai et al. | |
| 7,375,476 B2 | 5/2008 | Walter et al. | |
| 7,388,764 B2 | 6/2008 | Huynh et al. | |
| 7,394,210 B2 | 7/2008 | Ashdown | |
| 7,511,437 B2 | 3/2009 | Lys et al. | |
| 7,538,499 B2 | 5/2009 | Ashdown | |
| 7,545,130 B2 | 6/2009 | Latham | |
| 7,554,473 B2 | 6/2009 | Melanson | |
| 7,569,996 B2 | 8/2009 | Holmes et al. | |
| 7,583,136 B2 | 9/2009 | Pelly | |
| 7,656,103 B2 | 2/2010 | Shteynberg et al. | |
| 7,710,047 B2 | 5/2010 | Shteynberg et al. | |
| 7,719,248 B1 | 5/2010 | Melanson | |
| 7,746,043 B2 | 6/2010 | Melanson | |
| 7,746,671 B2 | 6/2010 | Radecker et al. | |
| 7,750,738 B2 | 7/2010 | Bach | |
| 7,804,256 B2 | 9/2010 | Melanson | |
| 2002/0145041 A1 | 10/2002 | Muthu et al. | |
| 2002/0150151 A1 | 10/2002 | Krone et al. | |
| 2002/0166073 A1 | 11/2002 | Nguyen et al. | |
| 2003/0095013 A1 | 5/2003 | Melanson et al. | |
| 2003/0174520 A1 | 9/2003 | Bimbaud | |
| 2003/0223255 A1 | 12/2003 | Ben-Yaakov | |
| 2004/0004465 A1 | 1/2004 | McGinnis | |
| 2004/0046683 A1 | 3/2004 | Mitamura et al. | |
| 2004/0085030 A1 | 5/2004 | Laflamme et al. | |
| 2004/0085117 A1 | 5/2004 | Melbert et al. | |
| 2004/0169477 A1 | 9/2004 | Yancie et al. | |
| 2004/0227571 A1 | 11/2004 | Kuribayashi | |
| 2004/0228116 A1 | 11/2004 | Miller et al. | |
| 2004/0232971 A1 | 11/2004 | Kawasaki et al. | |
| 2004/0239262 A1 | 12/2004 | Ido et al. | |
| 2004/0263140 A1 * | 12/2004 | Adragna et al. | 323/282 |
| 2005/0057237 A1 | 3/2005 | Clavel | |
| 2005/0156770 A1 | 7/2005 | Melanson | |
| 2005/0168492 A1 | 8/2005 | Hekstra et al. | |
| 2005/0184895 A1 | 8/2005 | Petersen et al. | |
| 2005/0207190 A1 | 9/2005 | Gritter | |

| | | | |
|---|---|---|---|
| 2005/0218838 A1 | 10/2005 | Lys | |
| 2005/0253533 A1 | 11/2005 | Lys et al. | |
| 2005/0270813 A1 | 12/2005 | Zhang et al. | |
| 2005/0275354 A1 | 12/2005 | Hausman, Jr. et al. | |
| 2005/0275386 A1 | 12/2005 | Jepsen et al. | |
| 2006/0022916 A1 | 2/2006 | Aiello | |
| 2006/0023002 A1 | 2/2006 | Hara et al. | |
| 2006/0125420 A1 | 6/2006 | Boone et al. | |
| 2006/0214603 A1 | 9/2006 | Oh et al. | |
| 2006/0226795 A1 | 10/2006 | Walter et al. | |
| 2006/0238136 A1 | 10/2006 | Johnson, III et al. | |
| 2006/0261754 A1 | 11/2006 | Lee | |
| 2006/0285365 A1 | 12/2006 | Huynh et al. | |
| 2007/0024213 A1 | 2/2007 | Shteynberg et al. | |
| 2007/0029946 A1 | 2/2007 | Yu et al. | |
| 2007/0040512 A1 | 2/2007 | Jungwirth et al. | |
| 2007/0053182 A1 | 3/2007 | Robertson | |
| 2007/0103949 A1 | 5/2007 | Tsuruya | |
| 2007/0124615 A1 | 5/2007 | Orr | |
| 2007/0182699 A1 | 8/2007 | Ha et al. | |
| 2008/0012502 A1 | 1/2008 | Lys | |
| 2008/0043504 A1 | 2/2008 | Ye et al. | |
| 2008/0054815 A1 | 3/2008 | Kotikalapoodi et al. | |
| 2008/0130322 A1 | 6/2008 | Artusi et al. | |
| 2008/0174291 A1 | 7/2008 | Hansson et al. | |
| 2008/0174372 A1 | 7/2008 | Tucker et al. | |
| 2008/0175029 A1 | 7/2008 | Jung et al. | |
| 2008/0192509 A1 | 8/2008 | Dhuyvetter et al. | |
| 2008/0224635 A1 | 9/2008 | Hayes | |
| 2008/0232141 A1 | 9/2008 | Artusi et al. | |
| 2008/0239764 A1 | 10/2008 | Jacques et al. | |
| 2008/0259655 A1 | 10/2008 | Wei et al. | |
| 2008/0278132 A1 | 11/2008 | Kesterson et al. | |
| 2009/0067204 A1 | 3/2009 | Ye et al. | |
| 2009/0147544 A1 | 6/2009 | Melanson | |
| 2009/0174479 A1 | 7/2009 | Yan et al. | |
| 2009/0218960 A1 | 9/2009 | Lyons et al. | |

FOREIGN PATENT DOCUMENTS

| | | | |
|---|---|---|---|
| EP | 0910168 A1 | 4/1999 | |
| EP | 1014563 | 6/2000 | |
| EP | 1164819 A | 12/2001 | |
| EP | 1213823 A2 | 6/2002 | |
| EP | 1528785 A | 5/2005 | |
| EP | 2204905 A1 | 7/2010 | |
| GB | 2069269 A | 8/1981 | |
| JP | WO 2006/022107 A2 | 3/2006 | |
| WO | 01/15316 A1 | 1/2001 | |
| WO | 01/97384 A | 12/2001 | |
| WO | 02/15386 A2 | 2/2002 | |
| WO | W00227944 | 4/2002 | |
| WO | 02/091805 A2 | 11/2002 | |
| WO | 2006/067521 A | 6/2006 | |
| WO | WO2006135584 | 12/2006 | |
| WO | 2007/026170 A | 3/2007 | |
| WO | 2007/079362 A | 7/2007 | |

OTHER PUBLICATIONS

International Rectifier, Data Sheet No. PD60230 revC, IR1150(S)(PbF), uPFC One Cycle Control PFC IC Feb. 5, 2007.
Texas Instruments, Application Report SLUA308, UCC3817 Current Sense Transformer Evaluation, Feb. 2004.
Texas Instruments, Application Report SPRA902A, Average Current Mode Controlled Power Factor Correctiom Converter using TMS320LF2407A, Jul. 2005.
Unitrode, Design Note DN-39E, Optimizing Performance in UC3854 Power Factor Correction Applications, Nov. 1994.
Fairchild Semiconductor, Application Note 42030, Theory and Application of the ML4821 Average Currrent Mode PFC Controller, Aug. 1997.
Fairchild Semiconductor, Application Note AN4121, Design of Power Factor Correction Circuit Using FAN7527B, Rev.1.0.1, May 30, 2002.
Fairchild Semiconductor, Application Note 6004, 500W Power-Factor-Corrected (PFC) Converter Design with FAN4810, Rev. 1.0.1, Oct. 31, 2003.
Fairchild Semiconductor, FAN4822, ZVA Average Current PFC Controller, Rev. 1.0.1 Aug. 10, 2001.
Fairchild Semiconductor, ML4821, Power Factor Controller, Rev. 1.0.2, Jun. 19, 2001.
Fairchild Semiconductor, ML4812, Power Factor Controller, Rev. 1.0.4, May 31, 2001.
Linear Technology, 100 Watt LED Driver, Linear Technology, 2006.
Fairchild Semiconductor, FAN7544, Simple Ballast Controller, Rev. 1.0.0, 2004.
Fairchild Semiconductor, FAN7532, Ballast Controller, Rev. 1.0.2, Jun. 2006.
Fairchild Semiconductor, FAN7711, Ballast Control IC, Rev. 1.0.2, Mar. 2007.
Fairchild Semiconductor, KA7541, Simple Ballast Controller, Rev. 1.0.3, 2001.
ST Microelectronics, L6574, CFL/TL Ballast Driver Preheat and Dimming, Sep. 2003.
ST Microelectronics, AN993, Application Note, Electronic Ballast with PFC Using L6574 and L6561, May 2004.
International Search Report and Written Opinion for PCT/US2008/062384 dated Jan. 14, 2008.
S. Dunlap et al., Design of Delta-Sigma Modulated Switching Power Supply, Circuits & Systems, Proceedings of the 1998 IEEE International Symposium, 1998.
Texas Instruments, Interleaving Continuous Conduction Mode PFC Controller, UCC28070, SLUS794C, Nov. 2007, revised Jun. 2009, Texas Instruments, Dallas TX.
Freescale Semiconductor, Inc., Dimmable Light Ballast with Power Factor Correction, Design Reference Manual, DRM067, Rev. 1, Dec. 2005.
J. Zhou et al., Novel Sampling Algorithm for DSP Controlled 2 kW PFC Converter, IEEE Transactions on Power Electronics, vol. 16, No. 2, Mar. 2001.
A. Prodic, Compensator Design and Stability Assessment for Fast Voltage Loops of Power Factor Correction Rectifiers, IEEE Transactions on Power Electronics, vol. 22, No. 5, Sep. 2007.
M. Brkovic et al., "Automatic Current Shaper with Fast Output Regulation and Soft-Switching," S.15.C Power Converters, Telecommunications Energy Conference, 1993.
Dallas Semiconductor, Maxim, "Charge-Pump and Step-Up DC-DC Converter Solutions for Powering White LEDs in Series or Parallel Connections," Apr. 23, 2002.
Freescale Semiconductor, AN3052, Implementing PFC Average Current Mode Control Using the MC9S12E128, Nov. 2005.
D. Maksimovic et al., "Switching Converters with Wide DC Conversion Range," Institute of Electrical and Electronic Engineer's (IEEE) Transactions on Power Electronics, Jan. 1991.
V. Nguyen et al., "Tracking Control of Buck Converter Using Sliding-Mode with Adaptive Hysteresis," Power Electronics Specialists Conference, 1995. PESC apos; 95 Record., 26th Annual IEEE vol. 2, Issue , Jun. 18-22, 1995 pp. 1086-1093.
S. Zhou et al., "A High Efficiency, Soft Switching DC-DC Converter with Adaptive Current-Ripple Control for Portable Applications," IEEE Transactions on Circuits and Systems—II: Express Briefs, vol. 53, No. 4, Apr. 2006.
K. Leung et al., "Use of State Trajectory Prediction in Hysteresis Control for Achieving Fast Transient Response of the Buck Converter," Circuits and Systems, 2003. ISCAS apos;03. Proceedings of the 2003 International Symposium, vol. 3, Issue , May 25-28, 2003 pp. III-439-III-442 vol. 3.
K. Leung et al., "Dynamic Hysteresis Band Control of the Buck Converter with Fast Transient Response," IEEE Transactions on Circuits and Systems—II: Express Briefs, vol. 52, No. 7, Jul. 2005.
Y. Ohno, Spectral Design Considerations for White LED Color Rendering, Final Manuscript, Optical Engineering, vol. 44, 111302 (2005).
S. Skogstad et al., A Proposed Stability Characterization and Verification Method for High-Order Single-Bit Delta-Sigma Modulators, Norchip Conference, Nov. 2006 http://folk.uio.no/savskogs/pub/A_Proposed_Stability_Characterization.pdf.
J. Turchi, Four Key Steps to Design a Continuous Conduction Mode PFC Stage Using the NCP1653, ON Semiconductor, Publication Order No. AND184ID, Nov. 2004.

Megaman, D or S Dimming ESL, Product News, Mar. 15, 2007.

J. Qian et al., New Charge Pump Power-Factor-Correction Electronic Ballast with a Wide Range of Line Input Voltage, IEEE Transactions on Power Electronics, vol. 14, No. 1, Jan. 1999.

P. Green, A Ballast that can be Dimmed from a Domestic (Phase-Cut) Dimmer, IRPLCFL3 rev. b, International Rectifier, http://www.irf.com/technical-info/refdesigns/cfl-3.pdf, printed Mar. 24, 2007.

J. Qian et al., Charge Pump Power-Factor-Correction Technologies Part II: Ballast Applications, IEEE Transactions on Power Electronics, vol. 15, No. 1, Jan. 2000.

Chromacity Shifts in High-Power White LED Systems due to Different Dimming Methods, Solid-State Lighting, http://wwwi.lrc.rpi.edu/programs/solidstate/completedProjects.asp?ID=76, printed May 3, 2007.

S. Chan et al., Design and Implementation of Dimmable Electronic Ballast Based on Integrated Inductor, IEEE Transactions on Power Electronics, vol. 22, No. 1, Jan. 2007.

M. Madigan et al., Integrated High-Quality Rectifier-Regulators, IEEE Transactions on Industrial Electronics, vol. 46, No. 4, Aug. 1999.

T. Wu et al., Single-Stage Electronic Ballast with Dimming Feature and Unity Power Factor, IEEE Transactions on Power Electronics, vol. 13, No. 3, May 1998.

F. Tao et al., "Single-Stage Power-Factor-Correction Electronic Ballast with a Wide Continuous Dimming Control for Fluorescent Lamps," IEEE Power Electronics Specialists Conference, vol. 2, 2001.

Azoteq, IQS17 Family, IQ Switch®—ProxSense™ Series, Touch Sensor, Load Control and User Interface, IQS17 Datasheet V2.00.doc, Jan. 2007.

C. Dilouie, Introducing the LED Driver, EC&M, Sep. 2004.

S. Lee et al., TRIAC Dimmable Ballast with Power Equalization, IEEE Transactions on Power Electronics, vol. 20, No. 6, Nov. 2005.

L. Gonthier et al., EN55015 Compliant 500W Dimmer with Low-Losses Symmetrical Switches, 2005 European Conference on Power Electronics and Applications, Sep. 2005.

Why Different Dimming Ranges? The Difference Between Measured and Perceived Light, 2000 http://www.lutron.com/ballast/pdf/LutronBallastpg3.pdf.

D. Hausman, Real-Time Illumination Stability Systems for Trailing-Edge (Reverse Phase Control) Dimmers, Technical White Paper, Lutron, version 1.0, Dec. 2004, http://www.lutron.com/technical_info/pdf/RTISS-TE.pdf.

Light Dimmer Circuits, www.epanorama.net/documents/lights/lightdimmer.html, printed Mar. 26, 2007.

Light Emitting Diode, http://en.wikipedia.org/wiki/Light-emitting_diode, printed Mar. 27, 2007.

Color Temperature, www.sizes.com/units/color_temperature.htm, printed Mar. 27, 2007.

S. Lee et al., A Novel Electrode Power Profiler for Dimmable Ballasts Using DC Link Voltage and Switching Frequency Controls, IEEE Transactions on Power Electronics, vol. 19, No. 3, May 2004.

Y. Ji et al., Compatibility Testing of Fluorescent Lamp and Ballast Systems, IEEE Transactions on Industry Applications, vol. 35, No. 6, Nov./Dec. 1999.

National Lighting Product Information Program, Specifier Reports, "Dimming Electronic Ballasts," vol. 7, No. 3, Oct. 1999.

Supertex Inc., Buck-based LED Drivers Using the HV9910B, Application Note AN-H48, Dec. 28, 2007.

D. Rand et al., Issues, Models and Solutions for Triac Modulated Phase Dimming of LED Lamps, Power Electronics Specialists Conference, 2007.

Supertex Inc., HV9931 Unity Power Factor LED Lamp Driver, Application Note AN-H52, Mar. 7, 2007.

Supertex Inc., 56W Off-line LED Driver, 120VAC with PFC, 160V, 350mA Load, Dimmer Switch Compatible, DN-H05, Feb. 2007.

ST Microelectronics, Power Factor Corrector L6561, Jun. 2004.

Fairchild Semiconductor, Application Note 42047 Power Factor Correction (PFC) Basics, Rev. 0.9.0 Aug. 19, 2004.

M. Radecker et al., Application of Single-Transistor Smart-Power IC for Fluorescent Lamp Ballast, Thirty-Fourth Annual Industry Applications Conference IEEE, vol. 1, Oct. 3, 1999-Oct. 7, 1999.

M. Rico-Secades et al., Low Cost Electronic Ballast for a 36-W Fluorescent Lamp Based on a Current-Mode-Controlled Boost Inverter for a 120-V DC Bus Power Distribution, IEEE Transactions on Power Electronics, vol. 21, No. 4, Jul. 2006.

Fairchild Semiconductor, FAN4800, Low Start-up Current PFC/PWM Controller Combos, Nov. 2006.

Fairchild Semiconductor, FAN4810, Power Factor Correction Controller, Sep. 24, 2003.

Fairchild Semiconductor, FAN4822, ZVS Average Current PFC Controller, Aug. 10, 2001.

Fairchild Semiconductor, FAN7527B, Power Factor Correction Controller, 2003.

Fairchild Semiconductor, ML4821, Power Factor Controller, Jun. 19, 2001.

Freescale Semiconductor, AN1965, Design of Indirect Power Factor Correction Using 56F800/E, Jul. 2005.

International Search Report for PCT/US2008/051072, mailed Jun. 4, 2008.

"HV9931 Unity Power Factor LED Lamp Driver, Initial Release" 2005, Supertex Inc., Sunnyvale, CA USA.

AN-H52 Application Note: "HV9931 Unity Power Factor LED Lamp Driver" Mar. 7, 2007, Supertex Inc., Sunnyvale, CA USA.

Dustin Rand et al: "Issues, Models and Solutions for Triac Modulated Phase Dimming of LED Lamps" Power Electronics Specialists Conference, 2007. PESC 2007, IEEE, IEEE, P1, Jun. 1, 2007, pp. 1398-1404.

Spiazzi G et al: "Analysis of a High-Power-Factor Electronic Ballast for High Brightness Light Emitting Diodes" Power Electronics Specialists, 2005 IEEE 36th Conference on June 12, 2005, Piscatawa, NJ USA, IEEE, Jun. 12, 2005, pp. 1.

International Search Report PCT/US2008/062381 dates Feb. 5, 2008.

International Search Report PCT/US2008/056739 dated Dec. 3, 2008.

Written Opinion of the International Searching Authority PCT/US2008/062381 dated Feb. 5, 2008.

Ben-Yaakov et al, "The Dynamics of a PWM Boost Converter with Resistive Input" IEEE Transactions on Industrial Electronics, IEEE Service Center, Piscataway, NJ, USA, vol. 4, No. 3, Jun. 1, 1999.

International Search Report PCT/US2008/062398 dated Feb. 5, 2008.

Partial International Search Report PCT/US2008/062387 dated Feb. 5, 2008.

Noon, Jim "UC3855A/B High Performance Power Factor Preregulator", Texas Instruments, SLUA146A, May 1996, Revised Apr. 2004.

"High Performance Power Factor Preregulator", Unitrode Products from Texas Instruments, SLUS382B, Jun. 1998, Revised Oct. 2005.

International Search Report PCT/GB20006/003259 dated Jan. 12, 2007.

Written Opinion of the International Searching Authority PCT/US2008/056739.

International Search Report PCT/US2008/056606 dated Dec. 3, 2008.

Written Opinion of the International Searching Authority PCT/US2008/056606 dated Dec. 3, 2008.

International Search Report PCT/US2008/056608 dated Dec. 3, 2008.

Written Opinion of the International Searching Authority PCT/US2008/056608 dated Dec. 3, 2008.

International Search Report PCT/GB2005/050228 dated Mar. 14, 2006.

International Search Report PCT/US2008/062387 dated Jan. 10, 2008.

Data Sheet LT3496 Triple Output LED Driver, 2007, Linear Technology Corporation, Milpitas, CA.

News Release, Triple Output LED, LT3496.

Mamano, Bob, "Current Sensing Solutions for Power Supply Designers", Unitrode Seminar Notes SEM1200, 1999.

http://toolbarpdf.com/docs/functions-and-features-of-inverters.html printed on Jan. 20, 2011.

ST Datasheet L6562, Transition-Mode PFC Controller, 2005, STMicroelectronics, Geneva, Switzerland.

Maksimovic, Regan Zane and Robert Erickson, Impact of Digital Control in Power Electronics, Proceedings of 2004 International Symposium on Power Semiconductor Devices & Ics, Kitakyushu Apr. 5, 2010, Colorado Power Electronics Center, ECE Department, University of Colorado, Boulder, CO.
Infineon, CCM-PFC Standalone Power Factor Correction (PFC) Controller in Continuous Conduction Mode (CCM), Version 2.1, Feb. 6, 2007.
International Rectifier, IRAC1150-300W Demo Board, User's Guide, Rev 3.0, Aug. 2, 2005.
International Rectifier, Application Note AN-1077,PFC Converter Design with IR1150 One Cycle Control IC, rev. 2.3, Jun. 2005.
International Rectifier, Data Sheet PD60230 revC, Feb. 5, 2007.
Lu et al, International Rectifier, Bridgeless PFC Implementation Using One Cycle Control Technique, 2005.
Linear Technology, LT1248, Power Factor Controller, Apr. 20, 2007.
ON Semiconductor, AND8123/D, Power Factor Correction Stages Operating in Critical Conduction Mode, Sep. 2003.
ON Semiconductor, MC33260, GreenLine Compact Power Factor Controller: Innovative Circuit for Cost Effective Solutions, Sep. 2005.
ON Semiconductor, NCP1605, Enhanced, High Voltage and Efficient Standby Mode, Power Factor Controller, Feb. 2007.
ON Semconductor, NCP1606, Cost Effective Power Factor Controller, Mar. 2007.
ON Semiconductor, NCP1654, Product Review, Power Factor Controller for Compact and Robust, Continuous Conduction Mode Pre-Converters, Mar. 2007.
Philips, Application Note, 90W Resonant SMPS with TEA1610 SwingChip, AN99011, 1999.
NXP, TEA1750, GreenChip III SMPS control IC Product Data Sheet, Apr. 6, 2007.
Renesas, HA16174P/FP, Power Factor Correction Controller IC, Jan. 6, 2006.
Renesas Technology Releases Industry's First Critical-Conduction-Mode Power Factor Correction Control IC Implementing Interleaved Operation, Dec. 18, 2006.
Renesas, Application Note R2A20111 EVB, PFC Control IC R2A20111 Evaluation Board, Feb. 2007.
STMicroelectronics, L6563, Advanced Transition-Mode PFC Controller, Mar. 2007.
Texas Instruments, Application Note SLUA321, Startup Current Transient of the Leading Edge Triggered PFC Controllers, Jul. 2004.
Texas Instruments, Application Report, SLUA309A, Avoiding Audible Noise at Light Loads when using Leading Edge Triggered PFC Converters, Sep. 2004.
Texas Instruments, Application Report SLUA369B, 350-W, Two-Phase Interleaved PFC Pre-Regulator Design Review, Mar. 2007.
UNITRODE, High Power-Factor Preregulator, Oct. 1994.
Texas Instruments, Transition Mode PFC Controller, SLUS515D, Jul. 2005.
Unitrode Products From Texas Instruments, Programmable Output Power Factor Preregulator, Dec. 2004.
Unitrode Products From Texas Instruments, High Performance Power Factor Preregulator, Oct. 2005.
Texas Instruments, UCC3817 BiCMOS Power Factor Preregulator Evaluation Board User's Guide, Nov. 2002.
Unitrode, L. Balogh, Design Note UC3854A/B and UC3855A/B Provide Power Limiting with Sinusoidal Input Current for PFC Front Ends, SLUA196A, Nov. 2001.
A. Silva De Morais et al., A High Power Factor Ballast Using a Single Switch with Both Power Stages Integrated, IEEE Transactions on Power Electronics, vol. 21, No. 2, Mar. 2006.
M. Ponce et al., High-Efficient Integrated Electronic Ballast for Compact Fluorescent Lamps, IEEE Transactions on Power Electronics, vol. 21, No. 2, Mar. 2006.
A. R. Seidel et al., A Practical Comparison Among High-Power-Factor Electronic Ballasts with Similar Ideas, IEEE Transactions on Industry Applications, vol. 41, No. 6, Nov.-Dec. 2005.
F. T. Wakabayashi et al., An Improved Design Procedure for LCC Resonant Filter of Dimmable Electronic Ballasts for Fluorescent Lamps, Based on Lamp Model, IEEE Transactions on Power Electronics, vol. 20, No. 2, Sep. 2005.
J. A. Vilela Jr. et al., An Electronic Ballast with High Power Factor and Low Voltage Stress, IEEE Transactions on Industry Applications, vol. 41, No. 4, Jul./Aug. 2005.
S. T.S. Lee et al., Use of Saturable Inductor to Improve the Dimming Characteristics of Frequency-Controlled Dimmable Electronic Ballasts, IEEE Transactions on Power Electronics, vol. 19, No. 6, Nov. 2004.
M. K. Kazimierczuk et al., Electronic Ballast for Fluorescent Lamps, IEEE Transactions on Power Electronics, vol. 8, No. 4, Oct. 1993.
S. Ben-Yaakov et al., Statics and Dynamics of Fluorescent Lamps Operating at High Frequency: Modeling and Simulation, IEEE Transactions on Industry Applications, vol. 38, No. 6, Nov.-Dec. 2002.
H. L. Cheng et al., A Novel Single-Stage High-Power-Factor Electronic Ballast with Symmetrical Topology, IEEE Transactions on Power Electronics, vol. 50, No. 4, Aug. 2003.
J.W.F. Dorleijn et al., Standardisation of the Static Resistances of Fluorescent Lamp Cathodes and New Data for Preheating, Industry Applications Conference, vol. 1, Oct. 13-Oct. 18, 2002.
Q. Li et al., An Analysis of the ZVS Two-Inductor Boost Converter under Variable Frequency Operation, IEEE Transactions on Power Electronics, vol. 22, No. 1, Jan. 2007.
H. Peng et al, Modeling of Quantization Effects in Digitally Controlled DC-DC Converters, IEEE Transactions on Power Electronics, vol. 22, No. 1, Jan. 2007.
G. Yao et al., Soft Switching Circuit for Interleaved Boost Converters, IEEE Transactions on Power Electronics, vol. 22, No. 1, Jan. 2007.
C. M. De Oliviera Stein et al., A ZCT Auxiliary Communication Circuit for Interleaved Boost Converters Operating in Critical Conduction Mode, IEEE Transactions on Power Electronics, vol. 17, No. 6, Nov. 2002.
W. Zhang et al., A New Duty Cycle Control Strategy for Power Factor Correction and FPGA Implementation, IEEE Transactions on Power Electronics, vol. 21, No. 6, Nov. 2006.
H. Wu et al., Single Phase Three-Level Power Factor Correction Circuit with Passive Lossless Snubber, IEEE Transactions on Power Electronics, vol. 17, No. 2, Mar. 2006.
O. Garcia et al., High Efficiency PFC Converter to Meet EN61000-3-2 and A14, Proceedings of the 2002 IEEE International Symposium on Industrial Electronics, vol. 3, 2002.
P. Lee et al., Steady-State Analysis of an Interleaved Boost Converter with Coupled Inductors, IEEE Transactions on Industrial Electronics, vol. 47, No. 4, Aug. 2000.
D.K.W. Cheng et al., A New Improved Boost Converter with Ripple Free Input Current Using Coupled Inductors, Power Electronics and Variable Speed Drives, Sep. 21-23, 1998.
B.A. Miwa et al., High Efficiency Power Factor Correction Using Interleaved Techniques, Applied Power Electronics Conference and Exposition, Seventh Annual Conference Proceedings, Feb. 23-27, 1992.
Z. Lai et al., A Family of Power-Factor-Correction Controllers, Twelfth Annual Applied Power Electronics Conference and Exposition, vol. 1, Feb. 23-Feb. 27, 1997.
L. Balogh et al., Power-Factor Correction with Interleaved Boost Converters in Continuous-Inductor-Current Mode, Eighth Annual Applied Power Electronics Conference and Exposition, 1993. APEC '93. Conference Proceedings, Mar. 7-Mar. 11, 1993.
Fairchild Semiconductor, Application Note 42030, Theory and Application of the ML4821 Average Current Mode PFC Controller, Oct. 25, 2000.
Unitrode Products From Texas Instruments, BiCMOS Power Factor Preregulator, Feb. 2006.
Linear Technology, "Single Switch PWM Controller with Auxiliary Boost Converter," LT1950 Datasheet, Linear Technology, Inc. Milpitas, CA, 2003.
Yu, Zhenyu, 3.3V DSP for Digital Motor Control, Texas Instruments, Application Report SPRA550 dated Jun. 1999.
International Rectifier, Data Sheet No. PD60143-O, Current Sensing Single Channel Driver, El Segundo, CA, dated Sep. 8, 2004.
Balogh, Laszlo, "Design and Application Guide for High Speed MOSFET Gate Drive Circuits" [Online] 2001, Texas Instruments, Inc., SEM-1400, Unitrode Power Supply Design Seminar, Topic II, TI literature No. SLUP133, XP002552367, Retrieved from the Internet: URL:htt/://focus.ti.com/lit/ml/slup169/slup169.pdf the whole document.

Power Integrations, Inc., "TOP200-4/14 TOPSwitch Family Three-terminal Off-line PWM Switch", XP-002524650, Jul. 1996, Sunnyvale, California.

Texas Instruments, SLOS318F, "High-Speed, Low Noise, Fully-Differential I/O Amplifiers," THS4130 and THS4131, US, Jan. 2006.

International Search Report and Written Opinion, PCT US20080062387, dated Feb. 5, 2008.

International Search Report and Written Opinion, PCT US200900032358, dated Jan. 29, 2009.

Hirota, Atsushi et al, "Analysis of Single Switch Delta-Sigma Modulated Pulse Space Modulation PFC Converter Effectively Using Switching Power Device," IEEE, US, 2002.

Prodic, Aleksandar, "Digital Controller for High-Frequency Rectifiers with Power Factor Correction Suitable for On-Chip Implementation," IEEE, US, 2007.

International Search Report and Written Opinion, PCT US20080062378, dated Feb. 5, 2008.

International Search Report and Written Opinion, PCT US20090032351, dated Jan. 29, 2009.

Erickson, Robert W. et al, "Fundamentals of Power Electronics," Second Edition, Chapter 6, Boulder, CO, 2001.

Allegro Microsystems, A1442, "Low Voltage Full Bridge Brushless DC Motor Driver with Hall Commutation and Soft-Switching, and Reverse Battery, Short Circuit, and Thermal Shutdown Protection," Worcester MA, 2009.

Texas Instruments, SLUS828B, "8-Pin Continuous Conduction Mode (CCM) PFC Controller", UCC28019A, US, revised Apr. 2009.

Analog Devices, "120 kHz Bandwidth, Low Distortion, Isolation Amplifier", AD215, Norwood, MA, 1996.

Burr-Brown, ISO120 and ISO121, "Precision Los Cost Isolation Amplifier," Tucson AZ, Mar. 1992.

Burr-Brown, ISO130, "High IMR, Low Cost Isolation Amplifier," SBOS220, US, Oct. 2001.

International Search Report and Written Report PCT US20080062428 dated Feb. 5, 2008.

Prodic, A. et al, "Dead Zone Digital Controller for Improved Dynamic Response of Power Factor Preregulators," IEEE, 2003.

* cited by examiner

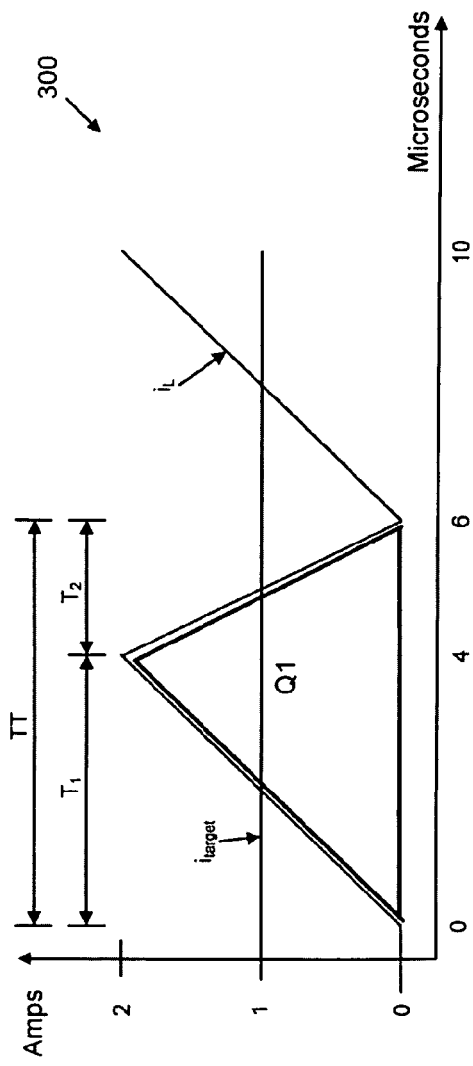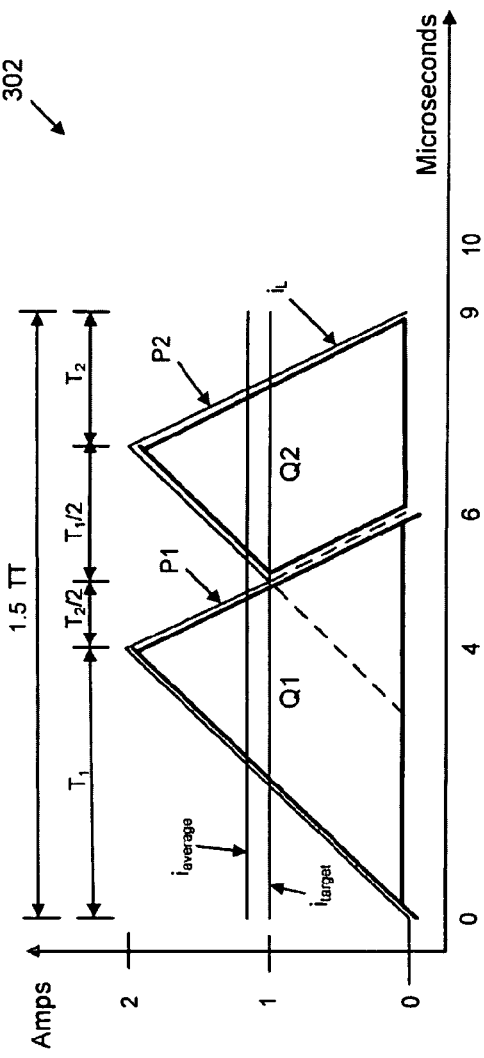

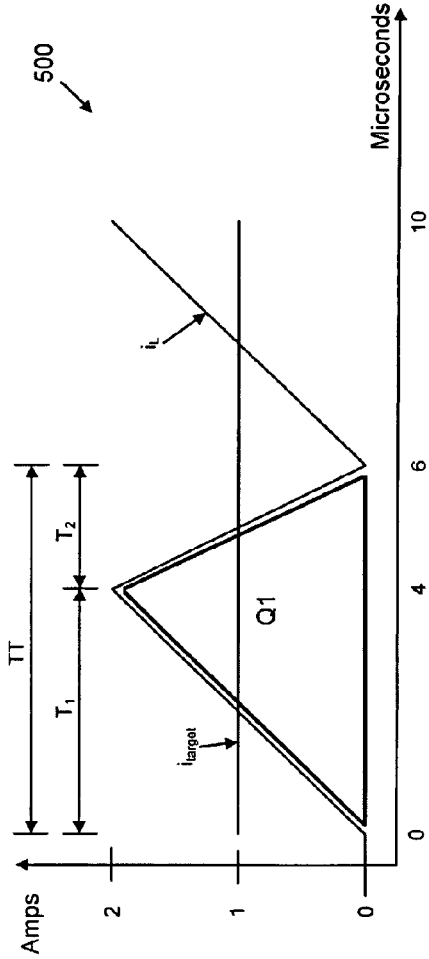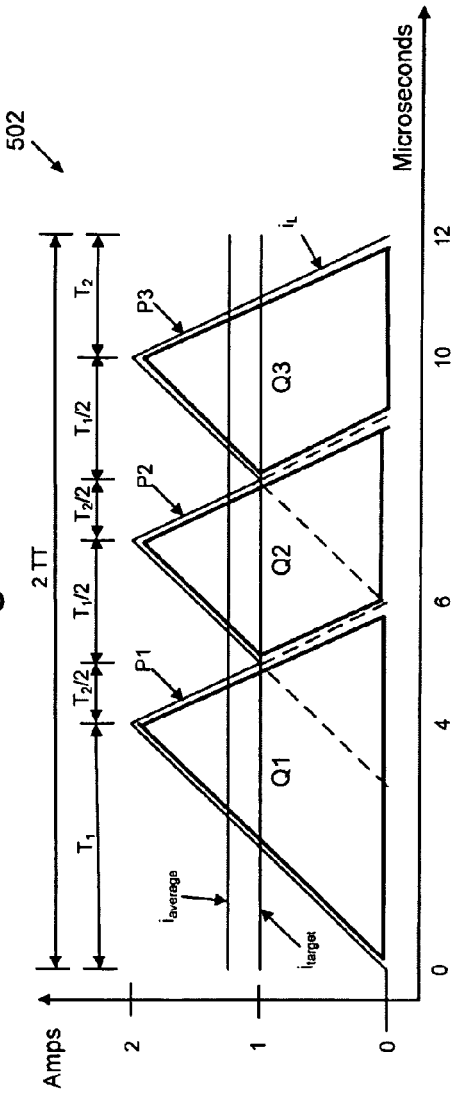
Figure 5A
Figure 5B

SWITCH-MODE CONVERTER OPERATING IN A HYBRID DISCONTINUOUS CONDUCTION MODE (DCM)/CONTINUOUS CONDUCTION MODE (CCM) THAT USES DOUBLE OR MORE PULSES IN A SWITCHING PERIOD

CROSS-REFERENCE TO RELATED APPLICATION

This application claims the benefit under 35 U.S.C. §119 (e) and 37 C.F.R §1.78 of U.S. Provisional Application No. 60/915,547, filed May 2, 2007, and entitled "Power Factor Correction (PFC) Controller Apparatuses and Methods," and is incorporated by reference in its entirety.

BACKGROUND OF THE INVENTION

1. Field of the Invention

The present invention relates in general to the field of signal processing, and, more specifically, to a switch-mode converter operating in a hybrid discontinuous conduction mode (DCM)/continuous conduction mode (CCM).

2. Description of the Related Art

Switch-mode converters are Direct Current (DC) to Direct Current (DC) converters that convert from one DC voltage level to another DC voltage level. A switch-mode converter operates by temporarily storing input energy at one voltage level and respectively releasing the energy at its output at a different voltage level. Two main exemplary switch-mode converters are a switch-mode boost converter and a switch-mode buck converter Both of these switch-mode converters are well known in the art.

An exemplary switch-mode boost converter/stage 102 is shown in a typical exemplary power factor corrector 100 in FIG. 1. Power factor correctors often utilize a switch-mode boost stage to convert alternating current (AC) voltages (such as line/mains voltages) to direct current (DC) voltages or DC-to-DC wherein the input current is proportional to the input voltage. Power factor correctors provide power factor corrected (PFC) and regulated output voltages to many devices that utilize a regulated output voltage. Switch-mode boost converter/stage 102 will now be explained in more detail in the context of power factor corrector 100.

Voltage source 101 supplies an alternating current (AC) input voltage $V_{in}(t)$ to a full-wave diode bridge rectifier 103. The voltage source 101 (e.g., voltage $V_{in}(t)$) is, for example, a public utility, such as a 60 Hz/120 V line (mains) voltage in the United States of America or a 50 Hz/230 V line (mains) voltage in Europe. The input rate associated with input voltage $V_{in}(t)$ is the frequency of voltage source 101 (e.g., 60 Hz in the U.S. and 50 Hz. in Europe). The rectifier 103 rectifies the input voltage $V_{in}(t)$ and supplies a rectified, time-varying, line input voltage $V_x(t)$ to the switch-mode boost stage 102. The actual voltage at any time t is referred to as the instantaneous input voltage. Unless otherwise stated, the term "line rate" is hereafter referred to and defined as the rectified input frequency associated with the rectified line voltage $V_x(t)$. The line rate is also equal to twice the input frequency associated with input voltage $V_{in}(t)$. The rectified line input voltage is measured and provided in terms of Root Mean Square (RMS) voltage, e.g., $V_{rms}$.

The switch-mode boost converter/stage 102 includes a switch 108 (e.g., Field Effect Transistor (FET)) by which it is controlled and provides power factor correction (PFC) in accordance with how switch 108 is controlled. The switch-mode boost converter/stage 102 is also controlled by switch 108 and regulates the transfer of energy from the rectified line input voltage $V_x(t)$ through inductor 110 to capacitor 106 via a diode 111. The inductor current $i_L$ ramps 'up' when the switch 108 conducts, i.e. is "ON". The inductor current $i_L$, ramps down when switch 108 is nonconductive, i.e. is "OFF", and supplies current $i_L$ to recharge capacitor 106. The time period during which inductor current $i_L$ ramps down is commonly referred to as the "inductor flyback time".

A switch-mode converter controller 114, such as an exemplary power factor correction (PFC) controller, controls switch 108. Switch-mode converter controller 114 controls switch 108 and, thus, controls power factor correction and regulates output power of the switch-mode boost converter/stage 102. The goal of power factor correction technology is to make the switch-mode boost converter/stage 102 appear resistive to the voltage source 101. Thus, the switch-mode converter controller 114 attempts to control the inductor current $i_L$ so that the average inductor current $i_L$ is linearly and directly related to the rectified line input voltage $V_x(t)$. Unitrode Products Datasheet entitled "UCC2817, UCC2818, UCC3817, UCC3818 BiCMOS Power Factor Preregulator" (SLUS3951) dated February 2000-Revised February 2006 by Texas Instruments Incorporated, Copyright 2006-2007 (referred to herein as "Unitrode datasheet") and International Rectifier Datasheet entitled "Datasheet No. PD60230 rev C IR1150(S(PbF) and IR 11501(S)(PbF)" dated Feb. 5, 2007 by International Rectifier, describe examples of a PFC controller. The PFC controller supplies a pulse width modulated (PWM) control signal $CS_0$ to control the conductivity of switch 108.

Two modes of switching stage operation exist: Discontinuous Conduction Mode ("DCM") and Continuous Conduction Mode ("CCM"). In DCM, switch 108 of switch-mode converter controller 114 (or boost converter) is turned on (e.g., "ON") when the inductor current $i_L$ equals zero. In CCM, switch 108 of switch-mode converter controller 114 (or boost converter) switches "ON" when the inductor current is nonzero, and the current in the energy transfer inductor 110 never reaches zero during the switching cycle. In CCM, the current swing is less than in DCM, which results in lower $I^2R$ power losses and lower ripple current for inductor current $i_L$ which results in lower inductor core losses. The lower voltage swing also reduces Electro Magnetic Interference (EMI), and a smaller input filter can then be used. Since switch 108 is turned "OFF" when the inductor current $i_L$ is not equal to zero, diode 111 needs to be very fast in terms of reverse recovery in order to minimize losses.

The switching rate for switch 108 is typically operated in the range of 20 kHz to 100 kHz. Slower switching frequencies are avoided in order to avoid the human audio frequency range as well as avoid increasing the size of inductor 110. Faster switching frequencies are typically avoided since they increase the switching losses and are more difficult to use in terms of meeting Radio Frequency Interference (RFI) standards.

Capacitor 106 supplies stored energy to load 112. The capacitor 106 is sufficiently large so as to maintain a substantially constant link output voltage $V_c(t)$ through the cycle of the line rate. The link output voltage $V_c(t)$ remains substantially constant during constant load conditions. However, as load conditions change, the link output voltage $V_c(t)$ changes. The switch-mode converter controller 114 responds to the changes in link output voltage $V_c(t)$ and adjusts the control signal $CS_0$ to resume a substantially constant output voltage as quickly as possible. The switch-mode converter controller 114 includes a small capacitor 115 to prevent any high frequency switching signals from the line (mains) input voltage $V_{in}(t)$.

Switch-mode converter controller 114 receives two feedback signals, the rectified line input voltage $V_x(t)$ and the link output voltage $V_c(t)$, via a wide bandwidth current loop 116 and a slower voltage loop 118. The rectified line input voltage $V_x(t)$ is sensed from node 120 between the diode rectifier 103 and inductor 110. The link output voltage $V_c(t)$ is sensed from node 122 between diode 111 and load 112. The current loop 116 operates at a frequency $f_c$ that is sufficient to allow the switch-mode converter controller 114 to respond to changes in the rectified line input voltage $V_x(t)$ and cause the inductor current $i_L$ to track the rectified line input voltage $V_x(t)$ to provide power factor correction. The inductor current $i_L$ controlled by the current loop 116 has a control bandwidth of 5 kHz to 10 kHz. The voltage loop 118 operates at a much slower frequency control bandwidth of about 5 Hz to 20 Hz. By operating at 5 Hz to 20 Hz, the voltage loop 118 functions as a low pass filter to filter a harmonic ripple component of the link output voltage $V_c(t)$.

FIG. 1B shows an exemplary switch-mode buck converter 150 that comprises the similar elements that were used for switch-mode boost converter/stage 102 in FIG. 1A. Switch-mode converter controller 114 is coupled to switch-mode buck converter 150. Switch-mode converter controller 114 executes a switch control algorithm which defines switching characteristics for the switch control signal $CS_0$ that is used to control switch 108.

Switch-mode buck converter 150 includes switch 108 coupled in series with inductor 110. One end of diode 111 is coupled between switch 108 and inductor 110 at the positive side of the input voltage Vin. The other end of diode 111 is coupled to the negative side of input voltage Vin. Capacitor 106 is coupled across the output voltage Vout. In contrast, for a switch-mode buck converter (e.g., switch-mode buck converter 150), the average inductor current is the output current of the buck converter, and the input current is approximately calculated as:

$$Iin = Iout * Vout/Vin \qquad \text{Equation A}$$

This mode of operation for the switch-mode buck converter requires the output voltage Vout to be less than the input voltage Vin. In some applications, the output current Iout is directly controlled, such as for LED lighting. In other applications, the output voltage Vout requires regulation, and current control is still desirable. In FIG. 1B, switch-mode converter controller 114 is coupled to switch-mode buck converter 150 in the manner shown. The current loop 152 operates at a frequency $f_c$ that is sufficient to allow the switch-mode converter controller 114 to respond to changes in the rectified line input voltage $V_x(t)$. A voltage feedback loop 154 controls the input to a current regulator.

With reference now to FIG. 2A, a plot 200 of exemplary DCM current waveforms is shown for a switch control algorithm for controlling a switch (e.g., switch 108) of a switch-mode boost converter (e.g., switch-mode boost converter/stage 102) at a time scale of 10 microseconds wherein the target current $i_{target}$ in FIG. 2A is set at 0.8 Amp. Plot 200 shows the current waveform for inductor current $i_L$ through inductor 110. Exemplary on-time $t_{on}$ and off-time $t_{off}$ are also shown. In this case, since the target current $i_{target}$ is low and below the exemplary minimum target current $i_{target}$ of 1 Amp for operating in CCM, the switch-mode boost converter/stage 102 operates in DCM.

With reference now to FIG. 2B, a plot 202 of exemplary DCM current waveforms is shown for a switch control algorithm for controlling a switch (e.g., switch 108) of a switch-mode boost converter (e.g., switch-mode boost converter/stage 102) at a time scale of 10 microseconds wherein the target current $i_{target}$ in FIG. 2A is set at or very close to 1 Amp (e.g., the exemplary minimum target current level $i_{target}$). Plot 202 shows the current waveform for inductor current $i_L$ through inductor 110. Exemplary on-time $t_{on}$ and off-time $t_{off}$ are again shown. In this case, since the target current $i_{target}$ is at or very close to the minimum target current $i_{target}$ of 1 Amp for operating in DCM, the switch-mode boost converter/stage 102 is in a transitional conduction mode in which operation of the switch-mode boost-stage/converter 102 may be able to be switched to CCM.

Several advantages of operating the switch-mode converter (e.g., switch-mode boost converter 102) in CCM exist. For example, "shoot-through" conduction, in which the diode (e.g., diode 111) and the switch (e.g., switch 108) are both on for the same (transient) time, does not exist. The switch (e.g., switch 108) always turns on with zero current (other than for parasitics). These advantages allow for good switch-mode conversion efficiency at low cost. Also, the control of the switch for the switch-mode converter can be entirely open loop, with no need to sense the actual inductor current.

However, there are disadvantages for operating a switch-mode converter in CCM. One disadvantage is that high ripple in the inductor current (e.g., inductor current $i_L$) exists. The switch-mode converter in CCM also has a limited power range. In CCM, the switch-mode converter has a peak current that is limited by the saturation limit of the inductor. The switch-mode converter in CCM is also limited by the current capability of the switch (e.g., switch 108) and diode (e.g., diode 111).

In various instances, transient power produced from a system utilizing a switch-mode converter is higher than the rated maximum. In a pure DCM system, components must be rated for the peak transient. Thus, it may be desired to allow a system with a switch-mode converter operating in DCM to enter into CCM operation on a temporary basis to allow the system to deliver more power. However, controlling such a system in CCM without current sensing has made for unreliable designs, as the inductor current can easily "run away" and become excessive.

Thus, it is needed and desired to provide a switch-mode converter that can operate in a mode that has the advantages of both DCM and CCM and that minimizes or eliminates at least some of the disadvantages of operating in CCM and/or DCM. It is further needed and desired to provide a way to operate the switch-mode converter in a hybrid DCM/CCM mode and to be able to operate in such a mode such that current sensing is not required. It is additionally needed and desired to be able to operate such a switch-mode converter in a hybrid DCM/CCM that can be used in a PFC system as well as for a number of other applications.

SUMMARY OF THE INVENTION

A switching converter controller and method that use a finite state machine configured to operate and control a switch-mode converter in a hybrid discontinuous conduction mode (DCM)/continuous conduction mode (CCM) mode are disclosed. The switch-mode converter has a switch and an inductor coupled to the switch, and the switch-mode converter receives an input voltage and provides an output voltage. The hybrid mode involves using double (two) or more switching pulses in a switching period of a control signal for controlling the switch-mode converter. The switching period is defined by a switch on-time duration, a switch off-time duration, and an N number of switching pulses. N is an integer greater than one. An inductor current through the inductor of the switch-mode converter is zero before an initial switching pulse, is zero after a last switching pulse, and is non-zero for all other times within the switching period.

In one exemplary embodiment, the N number of switching pulses is set equal two, and the switch-mode converter controller operates the switch-mode converter in a hybrid DCM/CCM double-pulse mode. In another exemplary embodiment, the N number of switching pulses is set equal three, and the switch-mode converter controller operates the switch-mode converter in a hybrid DCM/CCM triple-pulse mode.

In a further exemplary embodiment, for a subsequent switching pulse that is after the initial switching pulse and before the last switching pulse, the switch is turned on for a fraction of the on-time duration and the switch is turned off for the fraction of the off-time duration. The fraction is set to a value that is greater than zero and less than one and is defined by a ratio of a width of the subsequent switching pulse to a width of the initial switching pulse. The fraction can be selected as an exemplary optimal value in a range between 0.25 and 0.50.

Furthermore, the switching converter controller can be used as a power factor correction (PFC) controller for controlling is a switch-mode boost converter of a power factor corrector. Also, the switch-mode converter controller can be implemented on a single integrated circuit.

BRIEF DESCRIPTION OF THE DRAWINGS

The present invention may be better understood, and its numerous objects, features and advantages made apparent to those skilled in the all by referencing the accompanying drawings. The use of the same reference number throughout the several figures designates a like or similar element.

FIG. 3A depicts an exemplary switching period of current waveforms for a switch control algorithm wherein the exemplary target current is set at or close to a minimum target current for operating in CCM (at 1 Amp) and the switch-mode converter still operates in DCM and FIG. 3A is for comparing with FIG. 3B.

FIG. 3B depicts an exemplary switching period of current waveforms for a switch control algorithm wherein the switch-mode converter operates in the hybrid DCM/CCM double-pulse mode.

FIG. 5A depicts an exemplary switching period of current waveforms for a switch control algorithm wherein the exemplary target current is set at or close to a minimum target current for operating in CCM (at 1 Amp) and the switch-mode converter still operates in DCM and FIG. 5A is for comparing with FIG. 5B.

FIG. 5B depicts an exemplary switching period of current waveforms for a switch control algorithm wherein the switch-mode converter operates in the hybrid. DCM/CCM triple-pulse mode.

DETAILED DESCRIPTION

The present invention provides a switch-mode converter that operates in a mode, which is defined and disclosed as a hybrid DCM/CCM mode. A switch-mode converter operating in the hybrid DCM/CCM mode has advantages of both DCM and CCM. The hybrid DCM/CCM mode also minimizes or eliminates at least some of the disadvantages of operating in CCM and/or DCM. For example, a switch-mode converter operating in the hybrid DCM/CCM mode does not require the use of current sensing. Significantly more current can be delivered by the hybrid DCM/CCM mode as contrasted with the DCM, given the same power components. Two exemplary embodiments for operating the switch-mode converter will be discussed in detail in this specification: a hybrid DCM/CCM double-pulse mode and a hybrid DCM/CCM triple-pulse mode. However, the present invention is not in any way limited to being implemented by the use of just a double-pulse or triple pulse defined in the switching period, and additional pulses in the switching period may further be added and utilized as well. Practically, the number of pulses implemented in the switching period may be limited by the eventual mismatch between the current in the ideal model and the actual circuit that exists as additional pulses are added and used. Furthermore, such a switch-mode converter operating in a hybrid DCM/CCM can be used in a PFC system as well as for a number of other systems and applications. The systems and applications which incorporate the present invention are not in any way limited to the ones disclosed in this specification.

Figure 1A:
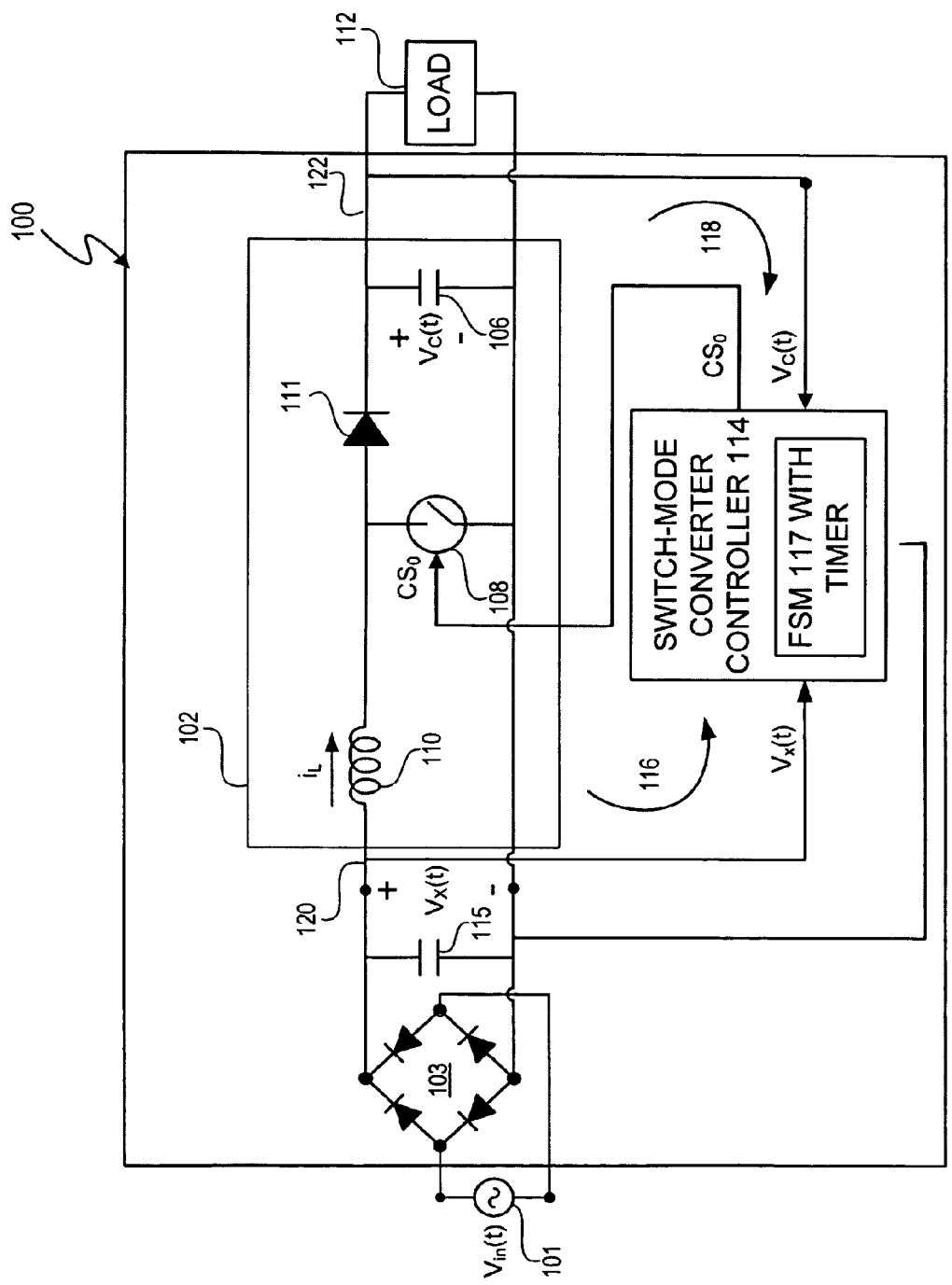
FIG. 1A depicts an exemplary switch-mode boost converter/stage coupled to a switch-mode converter controller that is a power factor correction (PFC) controller wherein the switch-mode boost converter/stage is being used in a power factor corrector.
Figure 1B:
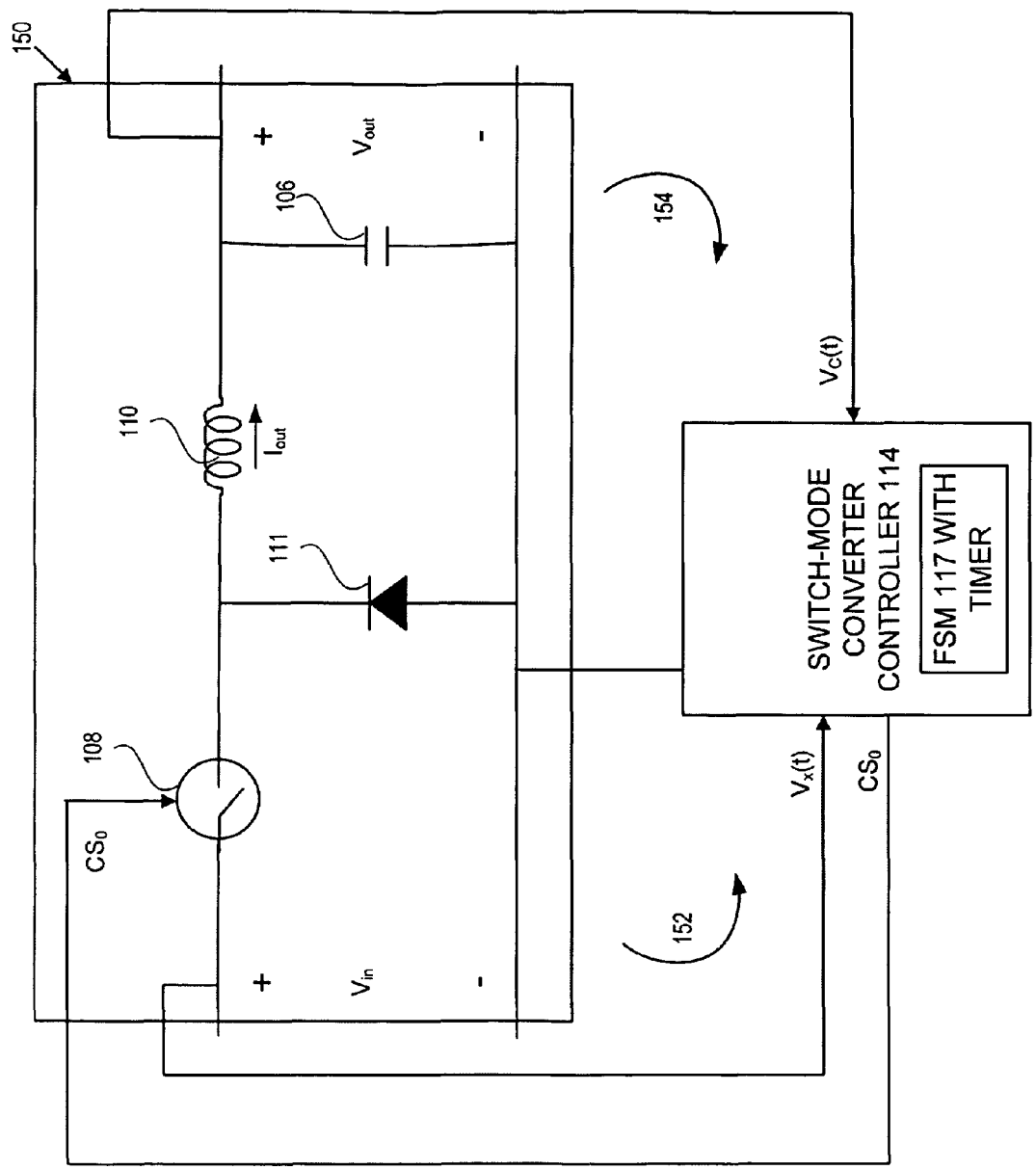
FIG. 1B depicts an exemplary switch-mode buck converter/stage coupled to a switch-mode converter controller.
Figure 2A:
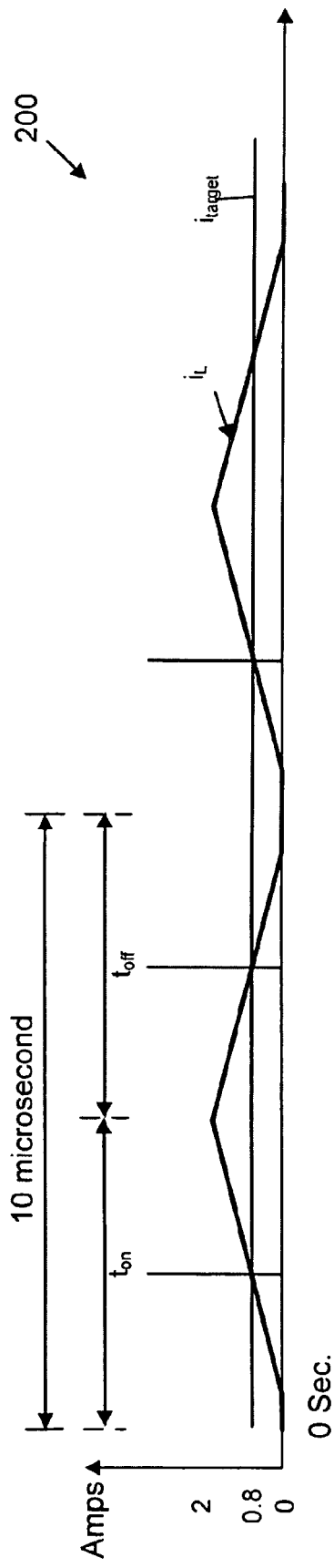
FIG. 2A depicts exemplary current waveforms for a switch control algorithm wherein the exemplary target current is set below a minimum target current for operating in CCM (at 0.8 Amp) and the switch-mode converter operates in DCM.
Figure 2B:
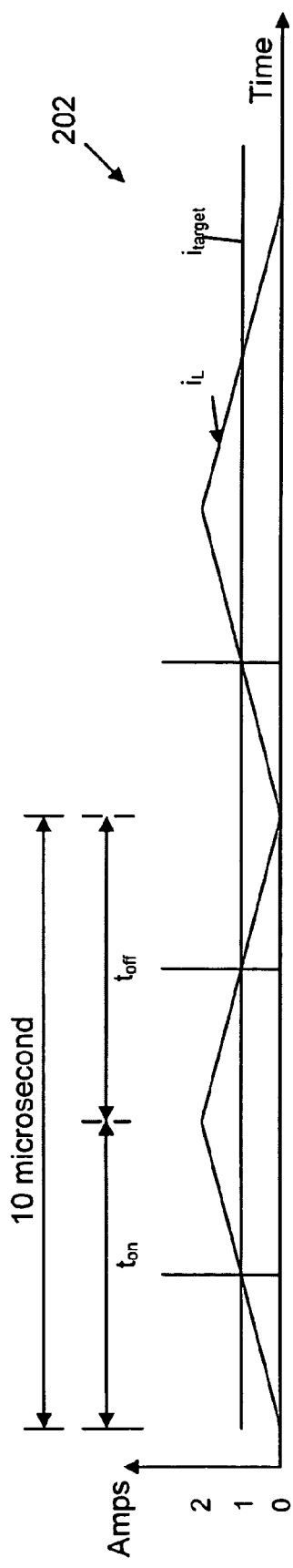
FIG. 2B depicts exemplary current waveforms for a switch control algorithm wherein the exemplary target current is set at or close to a minimum target current for operating in CCM (at 1 Amp) and the switch-mode converter still operates in DCM but may be able or close to switching to alternatively operating in CCM.

Switch-mode converter controller 114 of FIGS. 1A and 1B can be utilized and configured to operate the respective switch-mode converter 100 or 150 in the hybrid DCM/CCM mode in accordance with the principles of the present invention. Switch-mode converter 114 further has a finite state machine (FSM) 117 which includes a timer. The switch control algorithms defined by the characteristics of the exemplary current waveforms in FIGS. 3B and 5B and the corresponding state diagrams in FIGS. 4 and 6, which will be discussed in more detail later, can be implemented as FSM algorithms that are executed by FSM 117 and the timer. Thus, elements and components of switch-mode controller 114 and switch-mode converter 100 or 150 will be referenced when discussing the present invention in this specification.

FIG. 3A depicts a plot 300 which shows an exemplary switching period of current waveforms for a switch control algorithm. The switch control algorithm would be used, for example, to control switch 108 of switch-mode converter 102 or 150. In the exemplary current waveforms of FIG. 3A, the target current is set at or close to the exemplary minimum target current for operating a switch-mode converter in CCM, that is, 1 Amp in this example. Plot 300 shows that the exemplary switching period represented by the total time period TT. The total time period TT is the sum of the on-time duration $T_1$ and off-time duration $T_2$ of switch 108, that is, $$TT=T_1+T_2 \qquad \text{Equation B}$$

Referring specifically to the example in plot 300, on-time duration $T_1$ is equal to 4 microseconds while off-time duration $T_2$ is equal to 2 microseconds. Thus, the total time period TT for the switching period is 6 microseconds. The ratio of the on-time duration $T_1$ to the off-time duration $T_2$ is determined by the input and output voltages. In implementing a switch control algorithm based on the characteristics in plot 300 of FIG. 3A, the switch-mode converter 102 or 150 still operates in DCM. However, the switch-mode converter 102 or 150 may be able or close to switching to alternatively to operate in CCM since the target current is at the exemplary minimum target current level of 1 Amp for operating in CCM. Plot 300 of FIG. 3A will be used for comparison purposes with plot 302 of FIG. 3B.

FIG. 3B shows a plot 302 which depicts an exemplary switching period of current waveforms for a switch control algorithm in accordance with the principles of the present invention. The switch control algorithm would be used, for example, to control switch 108 of switch-mode converter 102 or 150. In the exemplary current waveforms of FIG. 3B, the switch-mode converter 102 or 150 operates in the hybrid DCM/CCM double-pulse mode.

Generally, the hybrid DCM/CCM mode for a switch mode converter involves adding one or more additional pulses (i.e., adding n pulses) to the switching period to further increase the average current $i_{average}$ of the inductor current $i_L$. For example, the hybrid DCM/CCM double-pulse mode involves having two switching pulses P1 and P2 defined in the switching period as shown in plot 302. Switching pulse P2 is defined and used in addition to the switching pulse P1 in the switching period. As another example, the hybrid DCM/CCM triple-pulse mode involves having three switching pulses P1, P2, and P3 defined in the switching period as shown in plot 502. Switching pulses P2 and P3 are defined and used in addition to the switching pulse P1 in the switching period.

The number of n pulses added is limited by the inaccuracy of the current model. Such inaccuracies include mismatches generally caused by parasitic components and non-zero on-voltages. For high voltage systems (e.g., 400 Volts), three to four pulses can be added to the switching period without the occurrence of significant current control error. Thus, these circuit non-idealities drive the average current $i_{average}$ for inductor current $i_L$ lower than what is modeled by simple mathematics so that destructive operation of the circuit is avoided. The model currents will drift away from the actual currents until such time as the inductor current $i_L$ is allowed to go to zero, and the process is re-started. The drift limits the practical number of pulses that can be added to the switching period. The number of subsequently added pulses, and hence additional current capacity, can be increased with more accurate modeling.

The general mathematical relationships for adding pulses (e.g., adding n pulses) in the switching period for controlling a switch in the switch-mode converter so that the switch-mode converter can operate in the hybrid DCM/CCM mode are now discussed. If n number of pulses are added to the switching period, the total charge transferred is defined as:

$$\text{Total Charge } Q=Q1*(1+n(1-(1-r)^2)) \qquad \text{Equation C}$$

where Q1 is the total charge for a single period of the inductor current $i_L$ operating in DCM (and not in the hybrid DCM/CCM mode) operating at the same peak current; n is the number of added pulses; and r is a fraction defined by the ratio of the width of subsequent pulses to the width of the initial pulse. The optimum value selected for r is usually in the range of 0.25 and 0.50.

Since n number of pulses is added to the switching period, the total time duration TT' (e.g., in FIGS. 3B and 5B) of the switching period becomes respectively longer than the total timer duration TT (e.g., in FIGS. 3A and 5B). For example, a first off-time duration $r*T_2$ is added to the total switching period, and a second on-time duration $r*T_1$ is also added to the total switching period. Thus, the total time duration TT' for the switching period is then determined by:

$$TT'=(T_1+T_2)*(1+n*r) \qquad \text{Equation D}$$

In other words, the total time duration TT' for the switch-mode converter operating in the hybrid DCM/CCM mode is defined as $(1+n*r)$ longer than the switching time period $TT=(T_1+T_2)$, that is, the total switching time period defined for when the switch-mode converter simply operates in DCM.

The average current for operating the switch-mode converter in the hybrid DCM/CCM mode is defined as follows:

$$i_{average}=Q/TT'=(Q1*(1+n(1-(1-r)^2)))/(T_1+T_2)*(1+n*r) \qquad \text{Equation E}$$

However, the average current (e.g., target current $i_{target}$) when the switch-mode converter is operating in DCM is defined as follows:

$$i_{target}=Q1/(T_1+T_2)=Q_1/TT \qquad \text{Equation F}$$

Thus, operating the switch-mode converter in the hybrid DCM/CCM mode provides an improved/additional average current over and in comparison with operating the switch-mode converter simply in the DCM mode, defined by the following ratio:

$$i_{average}/i_{target}=(1+n(1-(1-r)^2))/(1+n*r) \qquad \text{Equation G}$$

In other words, operating the switch-mode converter in the hybrid DCM/CCM mode provides $i_{average}/i_{target}$ more times average current than operating the switch-mode converter simply in DCM. r is selected within the range of 0.25 to 0.50 based on an optimal value calculation. Such a calculation is achieved by performing a derivative on the ratio $i_{average}/i_{target}$ defined in Equation G.

Referring now to the specific example in plot 302 of FIG. 3B, the charge area Q1 defined by a first set of bolded boundaries represents the charge defined in a first portion of the current waveform for inductor current $i_L$ when the switch-mode converter is operating in the hybrid DCM/CCM mode. The area Q1 in FIG. 3B is identical to the area Q1 defined by the bolded boundaries in FIG. 3A since area Q1 represents the charge defined for a single switching period of the current waveform for inductor current when the switch-mode converter is simply operating in DCM. Plot 302 further shows an additional charge area Q2 defined by a second set of bold boundaries. Area Q2 defines new/added charge for a second portion of the current waveform for inductor current $i_L$ when the switch-mode converter is operating in the hybrid DCM/

CCM mode. Since two pulses P1 and P2 (e.g., total N number of pulses=2 pulses in this case wherein N>1) are defined in the switching period, the switch-mode converter in this case is considered to be operating in the hybrid DCM/CCM double-pulse mode.

In this example of FIG. 3B, n is equal to 1 since pulse P2 is added, and r is set equal to 0.5. The total charge being transferred for the switching period is then calculated as:

Total Charge $Q=Q1*(1+1(1-(1-0.5)^2))=1.75*Q1$    Equation H

The total time duration. TT for the switching period is defined as:

(63)
$$TT' = (T_1 + T_2)*(1 + 1*0.5) = 1.5*(T_1 + T_2) \quad \text{Equation I}$$
$$= 1.5*TT = 1.5 \ (4 \ microsec.+2 \ microsec.)$$
$$= 9 \ microseconds$$

In other words, the total time duration TT for the switching period defined when the switch-mode converter is operating in the hybrid DCM/CCM mode (e.g., FIG. 3B) is 1.5 times longer than the switching period defined when the switch-mode converter is simply operating in DCM (e.g., FIG. 3A). FIG. 3B also shows that the total time duration TT' is the sum of on-time duration $T_1$+off-time duration $T_2/2$+on-time duration $T_1/2$+off-time duration $T_2$. This break down of the total time duration TT' will be used for the timing in controlling activation and deactivation of the switch (e.g., switch 108).

The current comparison ratio between the hybrid DCM/CCM mode and the DCM mode is then calculated as follows:

(66)
$$i_{average}/i_{target} = (1 + 1(1 - (1 - 0.5)^2))/(1 + 1*0.5) \quad \text{Equation J}$$
$$= 1.75/1.5 = 1.1666$$

That is, the average current provided when the switch-mode converter is operating in the hybrid DCM/CCM double-pulse mode is 1.1666 times the average current when the same switch-mode converter is simply operating in DCM. This comparison is shown in FIG. 3B where the $i_{average}$ line is at 1.1666 Amp while the $i_{target}$ line is at 1 Amp.

Figure 4:
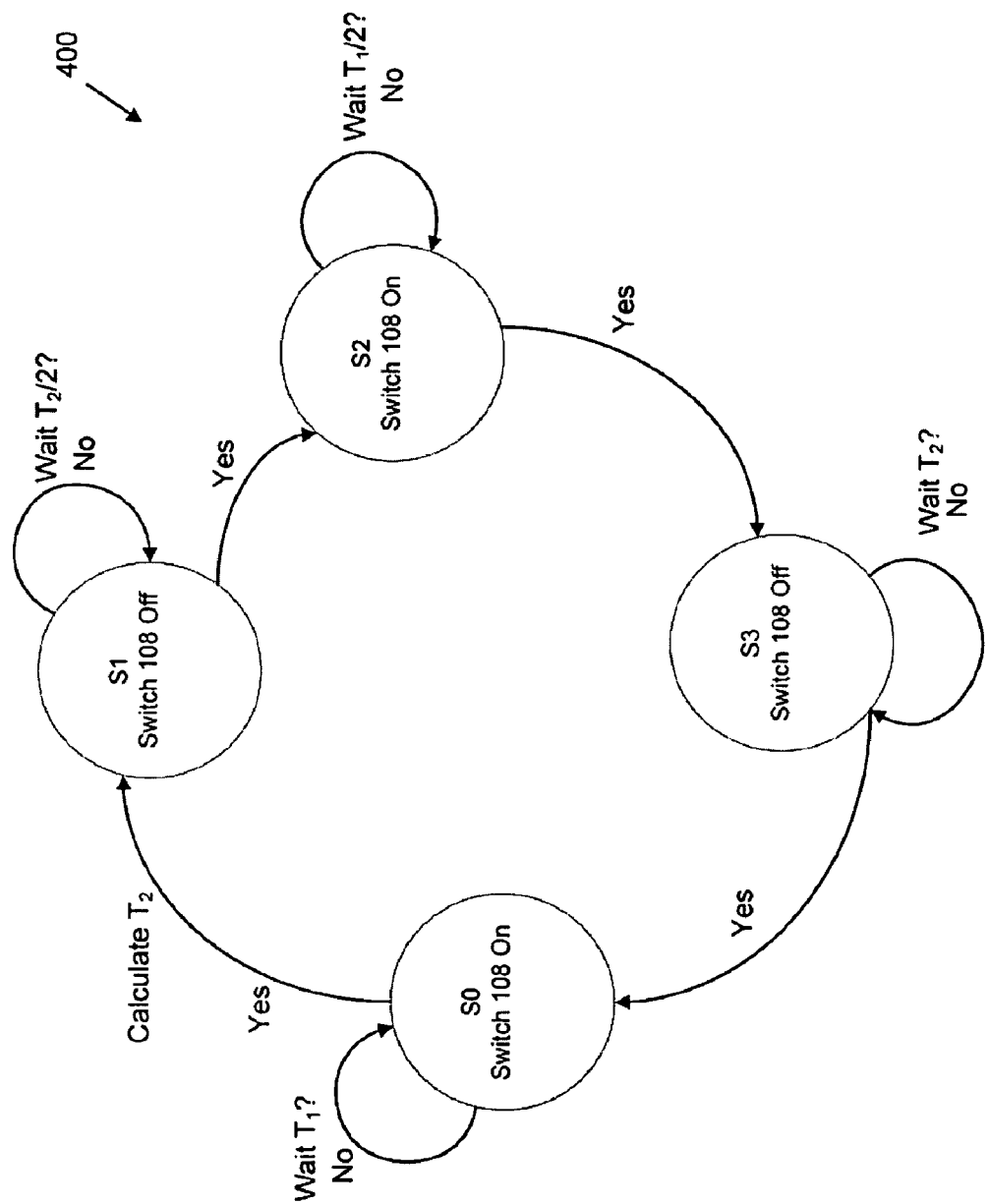
FIG. 4 depicts a state diagram for implementing by the switch-mode converter controller shown in FIGS. 1A and 1B the preferred switch control algorithm as characterized by the exemplary current waveforms of FIG. 3B for operating the switch-mode converter in the hybrid DCM/CCM double-pulse mode.

With reference now to FIG. 4, a state diagram 400 is shown for the FSM 117 in FIGS. 1A and 1B. State diagram 400 shows how the FSM algorithm implements the preferred switch control algorithm as characterized by the exemplary current waveforms of FIG. 3B for operating the switch-mode converter in the hybrid DCM/CCM double-pulse mode. The timer that is in FSM 117 is used in implementing and executing the switch timing for the FSM algorithm (e.g., switch control algorithm).

State diagram 400 shows that for this preferred control technique embodiment, FSM algorithm moves to a state S0 in which the timer is reset. At state S0, switch 108 is on, and the timer waits for an on-time duration $T_1$ (e.g., the on-time duration $T_1$ is the on-time duration defined by when the switch-mode converter would have been simply operating in DCM). When the timer reaches the end of the on-time duration $T_1$, the off-time duration $T_2$ (e.g., the off-time duration $T_2$ is the off-time duration defined by when the switch-mode converter would have been simply operating in DCM) is calculated or determined. The FSM algorithm then moves to state S1 in which switch 108 turns off, and the tinier is reset. FSM algorithm stays at state S1 until the timer tracks and waits an off-time duration $T_2/2$.

When the timer reaches the end of the off-time duration $T_2/2$, FSM algorithm then moves to state S2 in which the switch 108 is turned back on. Timer is again reset. FSM algorithm stays at state S2 until the timer tracks and waits an on-time duration $T_1/2$. When the timer reaches the end of the on-time duration $T_1/2$, FSM algorithm then moves to state S3 in which the switch 108 is turned back off. Timer is then reset. FSM algorithm stays at state S3 until the timer tracks and waits the off-time duration $T_2$. FSM algorithm then returns to state S0 and repeats the process therefrom.

FIG. 5A depicts a plot 500 which is identical to the plot 300 shown in FIG. 3A. Plot 500 in FIG. 5A is used for comparing exemplary current waveforms that are shown for operating the switch-mode converter in DCM with exemplary current waveforms in plot 502 in FIG. 5B for a switch-mode converter operating in the hybrid DCM/CCM mode.

Referring now to the specific example in plot 502 of FIG. 5B, the charge area Q1 defined by a first set of bolded boundaries represents the charge defined in a first portion of the current waveform for inductor current $i_L$ when the switch-mode converter is operating in the hybrid DCM/CCM mode. The area Q1 in FIG. 5B is identical to the area Q1 defined by the bolded boundaries in FIG. 5A since area Q1 represents the charge defined for a single switching period of the current waveform for inductor current $i_L$ when the switch-mode converter is simply operating in DCM. Plot 502 further shows an additional charge area Q2 defined by a second set of bold boundaries. Area Q2 defines new/added charge for a second portion of the current waveform for inductor current $i_L$ when the switch-mode converter is operating in the hybrid DCM/CCM mode. Plot 502 further shows a further additional charge area Q3 defined by a third set of bold boundaries. Area Q3 defines new/added charge for a third portion of the current waveform for inductor current $i_L$ when the switch-mode converter is operating in the hybrid DCM/CCM mode. Since three pulses P1, P2, and P3 (e.g., total N number of pulses=3 pulses in this case wherein N>1) are defined in the switching period, the switch-mode converter in this case is considered to be operating in the hybrid DCM/CCM triple-pulse mode. In this exemplary case, the switching pulse P2 is considered to be a subsequent pulse that is after the initial switching pulse P1 and before the last switching pulse P3.

In this example of FIG. 5B, n is equal to 2 since pulses P2 and P3 are added, and r is set equal to 0.5. The total charge being transferred for the switching period is then calculated as:

Total Charge $Q=Q1*(1+2(1-(1-0.5)^2))=2.5*Q1$    Equation H

The total time duration TT' for the switching period is defined as:

(76)
$$TT' = (T_1 + T_2)*(1 + 2*0.5)2*(T_1 + T_2) = 2*TT \quad \text{Equation I}$$
$$= 2*(4 \ microsec.+microsec.) = 12 \ microseconds$$

In other words, the total time duration TT' for the switching period defined when the switch-mode converter is operating in the hybrid DCM/CCM mode (e.g., FIG. 5B) is 2 times longer than the switching period defined when the switch-mode converter is simply operating in DCM (e.g., FIG. 5A). FIG. 5B also shows that the total time duration TT' is the sum of on-time duration $T_1$+off-time duration $T_2/2$+on-time duration $T_1/2$+off-time duration $T_2/2$+on-time duration $T_1/2$+off-time duration $T_2$. This break down of the total time duration TT will be used for the timing in controlling activation and deactivation of the switch (e.g., switch 108).

The current comparison ratio between the hybrid DCM/CCM mode and the DCM mode is then calculated as follows:

$$i_{average} / i_{target} = (1 + 2(1 - (1 - 0.5)^2))/(1 + 2*0.5) \quad \text{Equation J}$$
$$= 2.5/2 = 1.25$$

(79)

That is, the average current provided when the switch-mode converter is operating in the hybrid DCM/CCM triple-pulse mode is 1.25 times that when the switch-mode converter is simply operating in DCM. This comparison is shown in FIG. 5B where the $i_{average}$ line is at 1.25 Amp while the $i_{target}$ line is at 1 Amp.

Figure 6:
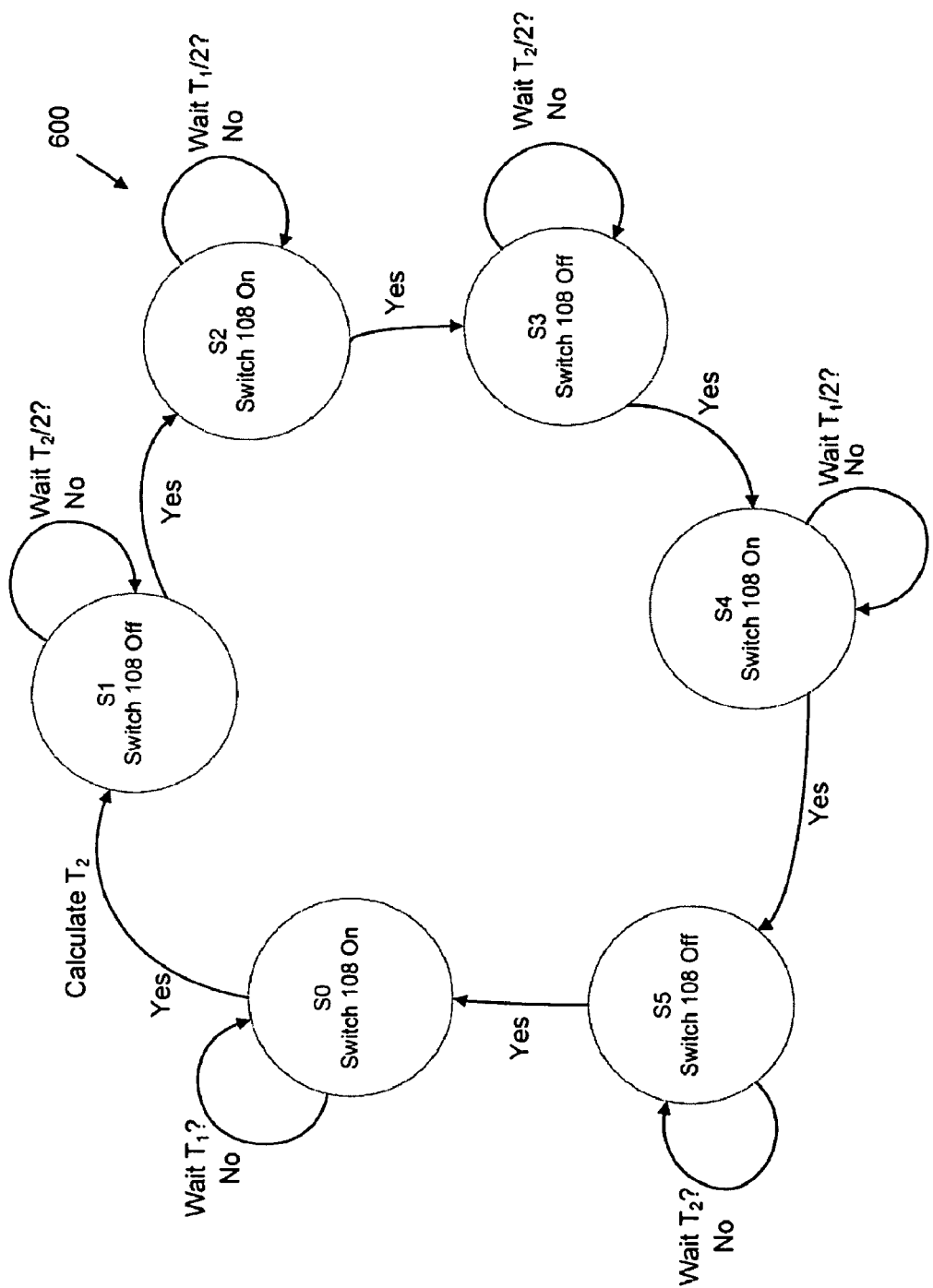
FIG. 6 depicts a state diagram for implementing by the switch-mode converter controller shown in FIGS. 1A and 1B the preferred switch control algorithm as characterized by the exemplary current waveforms of FIG. 5B for operating the switch-mode converter in the hybrid DCM/CCM triple-pulse mode.

With reference now to FIG. 6, a state diagram 600 is shown for the FSM 117 in FIGS. 1A and 1B. State diagram 600 shows how the FSM algorithm implements the preferred switch control algorithm as characterized by the exemplary current waveforms of FIG. 5B for operating the switch-mode converter in the hybrid DCM/CCM triple-pulse mode. The timer that is in FSM 117 is also used to implement and execute the timing for the FSM algorithm (e.g., switch control algorithm).

State diagram 600 shows that for this preferred control technique embodiment, FSM algorithm moves to a state S0 in which the timer is reset. At state S0, switch 108 is on, and the timer waits for an on-time duration $T_1$ (e.g., the on-time duration $T_1$ is the on-time duration defined by when the switch-mode converter would have been simply operating in DCM). When the timer reaches the end of the on-time duration $T_1$, the off-time duration $T_2$ (e.g., the off-time duration $T_2$ is the off-time duration defined by when the switch-mode converter would have been simply operating in DCM) is calculated or determined. The FSM algorithm then moves to state S1 in which switch 108 turns off, and the timer is reset. FSM algorithm stays at state S1 until the timer tracks and waits an off-time duration $T_2/2$.

When the timer reaches the end of the off-time duration $T_2/2$, FSM algorithm then moves to state S2 in which the switch 108 is turned back on. Timer is again reset. FSM algorithm stays at state S2 until the timer tracks and waits an on-time duration $T_1/2$. When the timer reaches the end of the on-time duration $T_1/2$, FSM algorithm then moves to state S3 in which the switch 108 is turned back off. Timer is then reset. FSM algorithm stays at state S3 until the timer tracks and waits an off-time duration $T_2/2$. When the timer reaches the end of the off-time duration $T_2/2$, FSM algorithm then moves to state S4 in which the switch 108 is turned back on. Timer is again reset. FSM algorithm stays at state S4 until the timer tracks and waits an on-time duration $T_1/2$. When the timer reaches the end of the on-time duration $T_1/2$, FSM algorithm then moves to state S5 in which the switch 108 is turned off. Timer is again reset. FSM algorithm stays at state S5 until the timer tracks and waits an off-time duration $T_2$. FSM algorithm stays at state S5 until the timer tracks and waits the off-time duration $T_2$. FSM algorithm then returns to state S0 and repeats the process therefrom.

Figure 7:
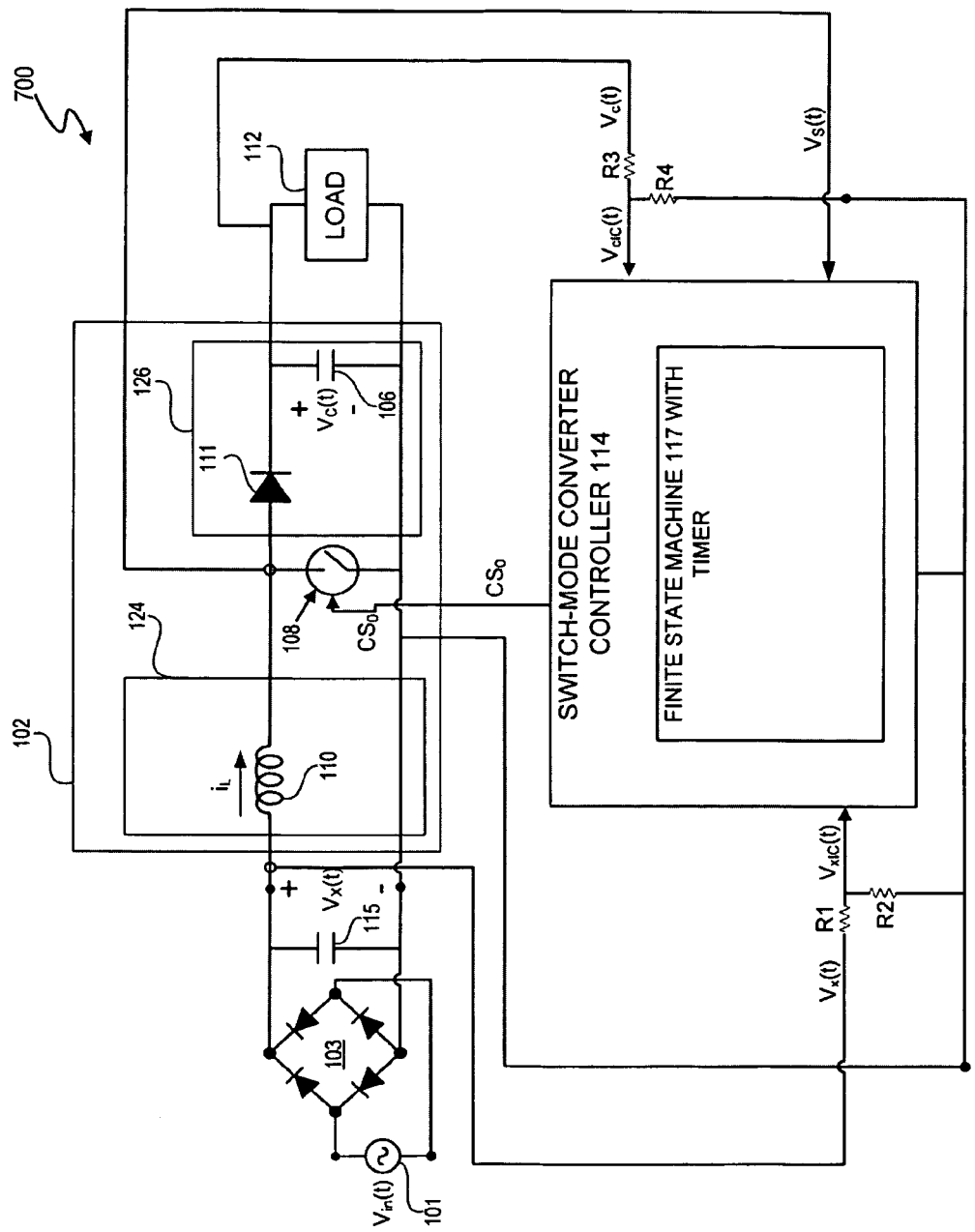
FIG. 7 depicts an exemplary power factor corrector that includes a switch-mode converter controller (PFC controller) on a single integrated circuit, that is able to incorporate and implement the FSM algorithms of the present invention, wherein the switch-mode converter controller is coupled to a switch-mode converter.

With reference now to FIG. 7, an exemplary power factor corrector 700 is shown. Power factor corrector 700 comprises full-wave diode bridge rectifier 103; capacitor 115; switch-mode converter 102, which is a switch-mode boost converter/stage; and switch-mode converter controller 114 which operates as a power factor correction (PFC) controller. These elements and components are coupled in the manner shown in FIG. 7. The switch-mode controller 114 (e.g., PFC controller) uses a finite state machine 117 that has a timer. Switch-mode converter 102 further includes inductor 110, diode 111, switch 108, and capacitor 106. A line (mains) voltage source 101 can couple to the input of power factor corrector 700, and a load 112 can couple to the output of power factor corrector 700.

Switching of switch 108 may be calculated and performed so that the average current of boost inductor current $i_L$, being the input current, varies proportionately with the rectified line input voltage $V_x(t)$ where the proportionality ratio is selected such that the capacitor link voltage/output voltage $V_c(t)$ is regulated. Switch-mode conversion controller 114 (PFC controller) and its operations and functions can be implemented on a single integrated circuit. A voltage divider comprising resistors R1 and R2 is coupled to the input of the switch-mode converter controller 114 where the input voltage $V_x(t)$ is fed in, and another voltage divider comprising resistors R3 and R4 is coupled to the input of the switch-mode converter controller 114 where the link output voltage $V_c(t)$ is fed in. The values for resistors R1, R2, R3, and R4 are selected so that the voltage dividers scale down the line input voltage $V_x(t)$ and link output voltage $V_c(t)$ to scaled line input voltage $V_{xIC}(t)$ and scaled link output voltage $V_{cIC}(t)$ that can be used for an integrated circuit.

In a power factor corrector, there are times in which extra current is desired for a short period of time. Such exemplary times include but are not limited to the time at the peak of the input sine-wave at low-line operation, during recovery from temporary input sag or brown-out, during start-up, and during load transients. The switch-mode converter controller 114 (e.g., PFC controller) that implements and executes the FSM algorithm (e.g., switch control algorithm) for controlling switch 108 to operate the switch-mode boost converter/stage 102 in the hybrid DCM/CCM mode can provide the advantages of providing such additional current during these times without adding additional components or complexity to the overall power factor corrector. Such advantages can further provide cost-savings and improve efficiency for the overall power factor corrector.

Furthermore, an error may exist between the actually observed off-time duration $T_2$ (e.g., observed as the actual off-time or flyback time of switch 108) and the above mathematically calculated off-time duration $T_2$. Such an error e is calculated as follows:

$$e = \text{Calculated } T_2 - \text{Observed } T_2 \quad \text{Equation K}$$

The error e can be compensated by dividing it among and during the off-times provided by the additional pulse(s) such that the current waveform for the inductor current $i_L$ (e.g., in FIGS. 3B and 5B) does not ramp or decay. For example, if the off-time $T_2$=Calculated $T_2/2$, then the updated off-time T2 maybe Updated Off-Time $T_2$=Calculated $T_2/2$−e/4. The inductor current $i_L$ can be accurately controlled after making a few iterations of error compensation. Such compensation for error e allows for a larger n number of pulses to be added to the switching period and in effect allow the average current $i_{average}$ be made higher. Such error compensation also allows the actual switch-mode conversion system to be calibrated against the mathematically modeled switch-mode conversion system.

An additional benefit of operating a switch-mode current in the hybrid DCM/CCM mode exists, even when operating it in DCM would be adequate for the required current. For example, when operating the switch-mode converter in the hybrid DCM/CCM mode, the current waveform for the inductor current $i_L$ is less repetitive, which causes less radio frequency interference (RFI) than when simply operating the switch-mode converter in DCM.

Although the present invention has been described in detail, it should be understood that various changes, substitutions and alterations can be made hereto without departing from the spirit and scope of the invention as defined by the appended claims.

What is claimed is:

1. A switching converter controller for controlling a switch-mode converter which has a switch and an inductor coupled to the switch wherein the switch-mode converter receives an input voltage and provides an output voltage, comprising:
a finite state machine configured to operate the switch-mode converter in a hybrid discontinuous conduction mode (DCM)/continuous conduction mode (CCM) mode;
wherein the finite state machine defines a switching period for a control signal for controlling the switch based on an on-time duration of the switch, an off-time duration of the switch, and an N number of switching pulses defined within the switching period wherein N is an integer greater than one and wherein an inductor current through the inductor is zero before an initial switching pulse of the N number of switching pulses, is zero after a last switching pulse of the N number of switching pulses, and is non-zero for all other times within the switching period: and
wherein the N number of switching pulses is two switching pulses and the hybrid DCM/CCM mode is a hybrid DCM/CCM double-pulse mode.

2. The switching converter controller of claim 1 wherein the switching converter controller is a power factor correction (PFC) controller for controlling the switch-mode converter that is a switch-mode boost converter.

3. A method for controlling a switch-mode converter which has a switch and an inductor coupled to the switch wherein the switch-mode converter receives an input voltage and provides an output voltage, comprising:
configuring to operate the switch-mode converter in a hybrid discontinuous conduction mode (DCM)/continuous conduction mode (CCM) mode;
defining a switching period for a control signal for controlling the switch based on an on-time duration of the switch, an off-time duration of the switch, and an N number of switching pulses defined within the switching period wherein N is an integer greater than one and wherein an inductor current through the inductor is zero before an initial switching pulse of the N number of switching pulses, is zero after a last switching pulse of the N number of switching pulses, and is non-zero for all other times within the switching period; and
defining a fraction, that is greater than zero and less than one, based on a ratio of a width of a subsequent switching pulse after the initial switching pulse and before the last switching pulse to a width of the initial switching pulse; and for the subsequent switching pulse, turning on the switch for a fraction of the on-time duration and turning off the switch for the fraction of the off-time duration.

4. The method of claim 3 wherein the N number of switching pulses is two switching pulses and further comprising:
configuring to operate the switch-mode converter in a hybrid DCM/CCM double-pulse mode.

5. The method of claim 3 wherein the N number of switching pulses is three switching pulses and further comprising:
configuring to operate the switch-mode converter in a hybrid DCM/CCM triple-pulse mode.

6. The method of claim 3 wherein defining the fraction further comprises:
selecting an optimal value for the fraction in a range between 0.25 and 0.50.

7. The method of claim 3 further comprising:
controlling the switch-mode converter that is a switch-mode boost converter which is used in a power factor corrector.

8. An integrated circuit which incorporates a switch-mode converter controller for controlling a switch-mode converter which has a switch and an inductor coupled to the switch wherein the switch-mode converter receives an input voltage and provides an output voltage, and wherein the switch-mode converter controller includes a finite state machine, the integrated circuit configured to:
operate the switch-mode converter in a hybrid discontinuous conduction mode (DCM)/continuous conduction mode (CCM) mode;
define a switching period for a control signal for controlling the switch based on an on-time duration of the switch, an off-time duration of the switch, and an N number of switching pulses defined within the switching period wherein N is an integer greater than one and wherein an inductor current through the inductor is zero before an initial switching pulse of the N number of switching pulses, is zero after a last switching pulse of the N number of switching pulses, and is non-zero for all other times within the switching period;
set the N number of switching pulses to two switching pulses; and
operate the switch-mode converter in a hybrid DCM/CCM double-pulse mode.

9. The integrated circuit of claim 8 further configured to:
control the switch-mode converter that is a switch-mode boost converter which is used in a power factor corrector.

10. A power factor corrector (PFC), comprising:
a switch-mode boost stage having a switch and an inductor coupled to the switch wherein the switch-mode boost stage receives a rectified line input voltage and provides a link output voltage;
a target current generator for receiving the link output voltage and for generating a target current proportionate to the rectified line input voltage; and
a finite state machine configured to operate the switch-mode boost stage in a hybrid discontinuous conduction mode (DCM)/continuous conduction mode (CCM) mode and;
wherein the finite state machine defines a switching period for a control signal for controlling the switch based on an on-time duration of the switch, an off-time duration of the switch, an N number of switching pulses defined within the switching period wherein N is an integer greater than one and wherein an inductor current through the inductor is zero before an initial switching pulse of the N number of switching pulses, is zero after a last switching pulse of the N number of switching pulses, and is non-zero for all other times within the switching period: and
wherein the N number of switching pulses is two switching pulses and the hybrid DCM/CCM mode is a hybrid DCM/CCM double-pulse mode.

11. A switching converter controller for controlling a switch-mode converter which has a switch and an inductor coupled to the switch wherein the switch-mode converter receives an input voltage and provides an output voltage, comprising:
- a finite state machine configured to operate the switch-mode converter in a hybrid discontinuous conduction mode (DCM)/continuous conduction mode (CCM) mode;
- wherein the finite state machine defines a switching period for a control signal for controlling the switch based on an on-time duration of the switch, an off-time duration of the switch, and an N number of switching pulses defined within the switching period wherein N is an integer greater than one and wherein an inductor current through the inductor is zero before an initial switching pulse of the N number of switching pulses, is zero after a last switching pulse of the N number of switching pulses, and is non-zero for all other times within the switching period; and
- wherein the N number of switching pulses is three switching pulses and the hybrid DCM/CCM mode is a hybrid DCM/CCM triple-pulse mode.

12. The switching converter controller of claim 11 wherein the switching converter controller is a power factor correction (PFC) controller for controlling the switch-mode converter that is a switch-mode boost converter.

13. A switching converter controller for controlling a switch-mode converter which has a switch and an inductor coupled to the switch wherein the switch-mode converter receives an input voltage and provides an output voltage, comprising:
- a finite state machine configured to operate the switch-mode converter in a hybrid discontinuous conduction mode (DCM)/continuous conduction mode (CCM) mode;
- wherein the finite state machine defines a switching period for a control signal for controlling the switch based on an on-time duration of the switch, an off-time duration of the switch, and an N number of switching pulses defined within the switching period wherein N is an integer greater than one and wherein an inductor current through the inductor is zero before an initial switching pulse of the N number of switching pulses, is zero after a last switching pulse of the N number of switching pulses, and is non-zero for all other times within the switching period; and
- wherein for a subsequent switching pulse after the initial switching pulse and before the last switching pulse, the switch is turned on for a fraction of the on-time duration and the switch is turned off for the fraction of the off-time duration, wherein the fraction is greater than zero and less than one and is defined by a ratio of a width of the subsequent switching pulse to a width of the initial switching pulse.

14. The switching converter controller of claim 13 wherein the fraction is selected as an optimal value in a range between 0.25 and 0.50.

15. The switching converter controller of claim 13 wherein the switching converter controller is a power factor correction (PFC) controller for controlling the switch-mode converter that is a switch-mode boost converter.

16. An integrated circuit which incorporates a switch-mode converter controller for controlling a switch-mode converter which has a switch and an inductor coupled to the switch wherein the switch-mode converter receives an input voltage and provides an output voltage, and wherein the switch-mode converter controller includes a finite state machine, the integrated circuit configured to:
- operate the switch-mode converter in a hybrid discontinuous conduction mode (DCM)/continuous conduction mode (CCM) mode;
- define a switching period for a control signal for controlling the switch based on an on-time duration of the switch, an off-time duration of the switch, and an N number of switching pulses defined within the switching period wherein N is an integer greater than one and wherein an inductor current through the inductor is zero before an initial switching pulse of the N number of switching pulses, is zero after a last switching pulse of the N number of switching pulses, and is non-zero for all other times within the switching period;
- set the N number of switching pulses to three switching pulses; and
- operate the switch-mode converter in a hybrid DCM/CCM triple-pulse mode.

17. The integrated circuit of claim 16 further configured to:
- control the switch-mode converter that is a switch-mode boost converter which is used in a power factor corrector.

18. An integrated circuit which incorporates a switch-mode converter controller for controlling a switch-mode converter which has a switch and an inductor coupled to the switch wherein the switch-mode converter receives an input voltage and provides an output voltage, and wherein the switch-mode converter controller includes a finite state machine, the integrated circuit configured to:
- operate the switch-mode converter in a hybrid discontinuous conduction mode (DCM)/continuous conduction mode (CCM) mode;
- define a switching period for a control signal for controlling the switch based on an on-time duration of the switch, an off-time duration of the switch, and an N number of switching pulses defined within the switching period wherein N is an integer greater than one and wherein an inductor current through the inductor is zero before an initial switching pulse of the N number of switching pulses, is zero after a last switching pulse of the N number of switching pulses, and is non-zero for all other times within the switching period;
- define a fraction, that is greater than zero and less than one, based on a ratio of a width of a subsequent switching pulse after the initial switching pulse and before the last switching pulse to a width of the initial switching pulse; and
- for the subsequent switching pulse, turn on the switch for a fraction of the on-time duration and turn off the switch for the fraction of the off time duration.

19. The integrated circuit of claim 18 further configured to:
select the fraction as an optimal value in a range between 0.25 and 0.50.

20. The integrated circuit of claim 18 further configured to:
control the switch-mode converter that is a switch-mode boost converter which is used in a power factor corrector.

21. A power factor corrector (PFC), comprising:
- a switch-mode boost stage having a switch and an inductor coupled to the switch wherein the switch-mode boost stage receives a rectified line input voltage and provides a link output voltage;
- a target current generator for receiving the link output voltage and for generating a target current proportionate to the rectified line input voltage; and
- a finite state machine configured to operate the switch-mode boost stage in a hybrid discontinuous conduction mode (DCM)/continuous conduction mode (CCM) mode and;

wherein the finite state machine defines a switching period for a control signal for controlling the switch based on an on-time duration of the switch, an off-time duration of the switch, an N number of switching pulses defined within the switching period wherein N is an integer greater than one and wherein an inductor current through the inductor is zero before an initial switching pulse of the N number of switching pulses, is zero after a last switching pulse of the N number of switching pulses, and is non-zero for all other times within the switching period; and wherein the N number of switching pulses is three switching pulses and the hybrid DCM/CCM mode is a hybrid DCM/CCM triple-pulse mode.

22. A power factor corrector (PFC), comprising:

a switch-mode boost stage having a switch and an inductor coupled to the switch wherein the switch-mode boost stage receives a rectified line input voltage and provides a link output voltage;

a target current generator for receiving the link output voltage and for generating a target current proportionate to the rectified line input voltage; and a finite state machine configured to operate the switch-mode boost stage in a hybrid discontinuous conduction mode (DCM)/continuous conduction mode (CCM) mode and;

wherein the finite state machine defines a switching period for a control signal for controlling the switch based on an on-time duration of the switch, an off-time duration of the switch, an N number of switching pulses defined within the switching period wherein N is an integer greater than one and wherein an inductor current through the inductor is zero before an initial switching pulse of the N number of switching pulses, is zero after a last switching pulse of the N number of switching pulses, and is non-zero for all other times within the switching period; and wherein for a subsequent switching pulse after the initial switching pulse and before the last switching pulse, the switch is turned on for a fraction of the on-time duration and the switch is turned off for the fraction of the off-time duration, wherein the fraction is greater than zero and less than one and is defined by a ratio of a width of the subsequent switching pulse to a width of the initial switching pulse.

23. The PFC of claim 22 wherein the fraction is selected as an optimal value in a range between 0.25 and 0.50.

\* \* \* \* \*